(12) United States Patent
Gosavi et al.

(10) Patent No.: US 11,574,666 B2
(45) Date of Patent: Feb. 7, 2023

(54) SPIN ORBIT TORQUE MEMORY DEVICES AND METHODS OF FABRICATION

(71) Applicant: Intel Corporation, Santa Clara, CA (US)

(72) Inventors: Tanay Gosavi, Hillsboro, OR (US); Sasikanth Manipatruni, Portland, OR (US); Chia-Ching Lin, Portland, OR (US); Kaan Oguz, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 851 days.

(21) Appl. No.: 16/246,362

(22) Filed: Jan. 11, 2019

(65) Prior Publication Data
US 2020/0227105 A1    Jul. 16, 2020

(51) Int. Cl.
| | | |
|---|---|---|
| *G11C 11/16* | (2006.01) | |
| *H01L 43/12* | (2006.01) | |
| *H01L 43/08* | (2006.01) | |
| *H01L 43/02* | (2006.01) | |
| *H01L 43/10* | (2006.01) | |
| *H01L 27/22* | (2006.01) | |

(52) U.S. Cl.
CPC ............ *G11C 11/161* (2013.01); *H01L 43/02* (2013.01); *H01L 43/08* (2013.01); *H01L 43/10* (2013.01); *H01L 43/12* (2013.01); *H01L 27/228* (2013.01)

(58) Field of Classification Search
CPC ....... G11C 11/161; H01L 43/02; H01L 43/08; H01L 43/10; H01L 27/228; H01F 10/329
See application file for complete search history.

(56) References Cited

U.S. PATENT DOCUMENTS

| | | | |
|---|---|---|---|
| 2016/0042778 A1* | 2/2016 | Manipatruni | H01L 27/228 365/66 |
| 2017/0005105 A1* | 1/2017 | Hara | H01L 27/11529 |
| 2018/0123027 A1* | 5/2018 | Yamane | H01L 43/12 |
| 2020/0083429 A1* | 3/2020 | Lee | H01L 43/12 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |

(Continued)

*Primary Examiner* — Shih Tsun A Chou
(74) *Attorney, Agent, or Firm* — Essential Patents Group, LLP

(57) ABSTRACT

A memory device includes a spin orbit electrode structure having a dielectric structure including a first sidewall, a second sidewall opposite to the first sidewall, a top surface. The spin orbit electrode structure further includes an electrode having a spin orbit material adjacent to the dielectric structure, where the electrode has a first electrode portion on the top surface, a second electrode portion adjacent to the first sidewall and a third electrode portion adjacent to the second sidewall. The first electrode portion, the second electrode portion and the third electrode portion are contiguous. The spin orbit electrode structure further includes a conductive interconnect in contact with the second electrode portion or the third electrode portion. The memory device further includes a magnetic junction device on a portion of the top surface of the first electrode portion.

19 Claims, 16 Drawing Sheets

(56) References Cited

U.S. PATENT DOCUMENTS

| | | |
|---|---|---|
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

* cited by examiner

SPIN ORBIT TORQUE MEMORY DEVICES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices for high density memory applications present formidable roadblocks to commercialization of this technology today. Specifically, increasing density of SOT memory devices in a given area of a wafer by reducing the cell size of the SOT memory device is an important area of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
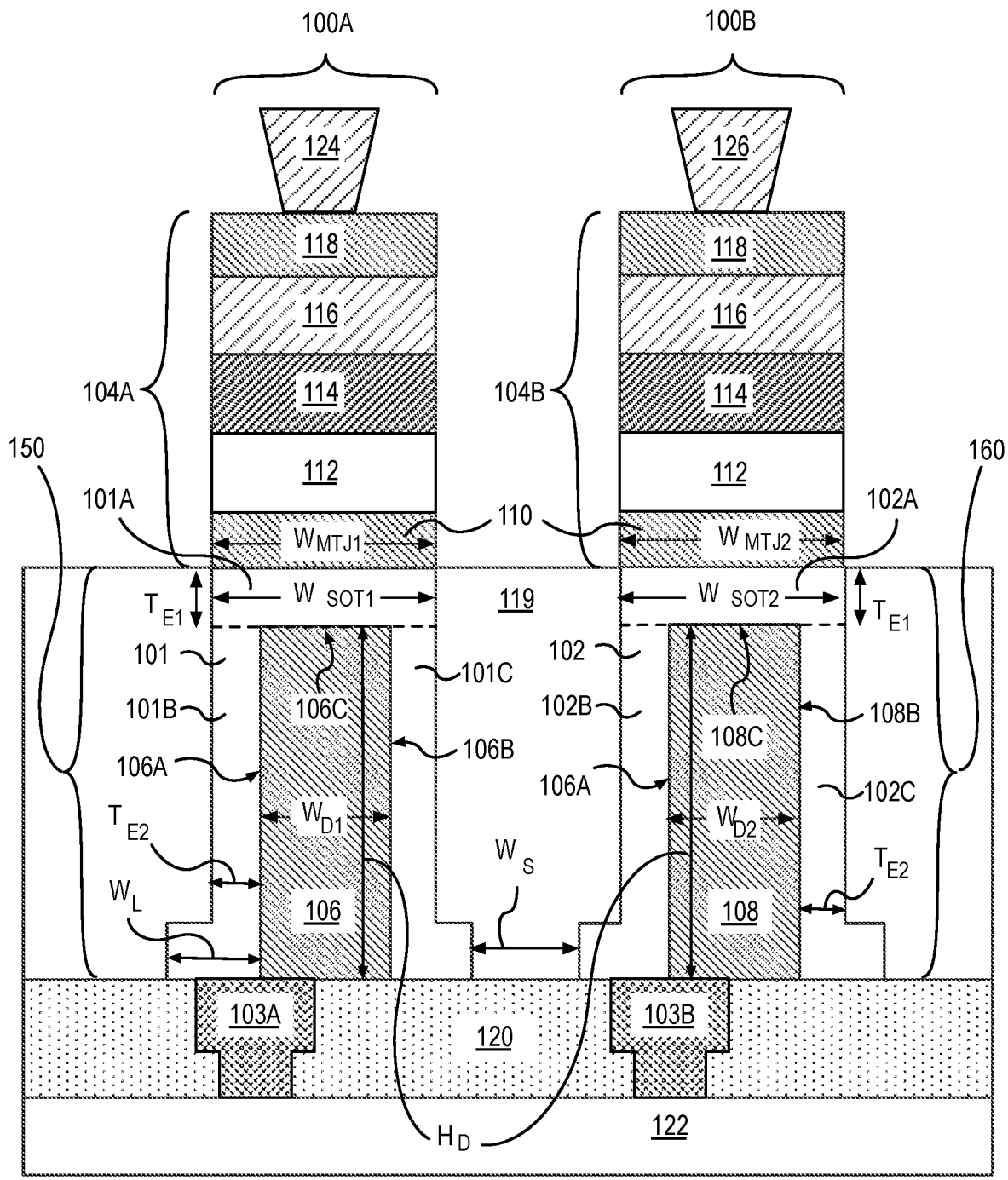
FIG. 1A illustrates a cross-sectional view of a pair of two terminal spin orbit torque (SOT) memory devices, in accordance with an embodiment of the present disclosure.

Spin orbit torque (SOT) memory devices for high density memory applications with and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along a plane of the magnet. For example, a magnet with a magnetization which is in an x or y direction and is in a range of 0 (or 180 degrees) +/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A SOT memory device may include a magnetic tunnel junction (MTJ) device formed on an electrode including a spin orbit material, herein a spin orbit torque (SOT) electrode. The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

In an embodiment, in an absence of a spin orbit torque electrode, resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when there is no current flowing through the MTJ device. For this reason, the MTJ device belongs to a class of memory known as non-volatile memory.

As an MTJ device is scaled down in size, the amount of critical spin polarized current density required to switch the device increases. By implementing an MTJ device on a SOT electrode, the magnetization in the free magnet may undergo torque assisted switching from a Spin Hall current, induced by passing an electrical current through the SOT electrode in a direction transverse to a thickness of the MTJ device material stack. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Electrons of a particular spin polarity are directed toward the MTJ device and impart a spin orbit torque on the magnetization of the free magnet that is typically in contact with the SOT electrode. The spin Hall current may also help the MTJ device switch faster. It is to be appreciated that, in an embodiment, the spin Hall current can fully switch a free magnet having a magnetization that is oriented in an in-plane direction. An in-plane direction is defined as a direction that is parallel to an uppermost surface of the spin orbit torque electrode. An external field may be utilized to exert a torque to completely switch the perpendicular free magnet from an in-plane direction.

As MTJ devices (formed on spin orbit torque electrode) are scaled, the need for smaller memory cell size has driven the industry in the direction of a SOT memory device based on a perpendicular MTJ (pMTJ). A pMTJ formed on a SOT electrode may be known as a pSOT memory device. The fixed magnet and the free magnet of the pMTJ memory device have magnetic anisotropy that are perpendicular with respect to a plane defining an uppermost surface of the spin orbit torque electrode. The pMTJ device may be scaled below 20 nm in diameter (for a circular plan-view cross section. However, scaling of SOT electrodes alongside with scaling of MTJ devices is an area of ongoing-development. Typically, SOT electrodes have a plan-view cross sectional area that is larger than a plan-view cross sectional area of an MTJ device. In some examples, the plan-view cross sectional area of the MTJ device is comparable to the plan-view cross sectional area of a scaled MTJ device, where the MTJ device has a diameter less than or equal to 20 nm, for example.

When pSOT memory devices are scaled, forming conductive interconnects to connect to form two or three terminal pSOT memory device can be very challenging. This problem can be even more challenging in an array including thousands of pSOT memory devices and in examples where the pSOT memory device is integrated onto access transistors. Integrating a non-volatile memory device such as an pSOT memory device onto access transistors enables the formation of embedded memory for system on chip (SOC) applications. However, approaches to integrate a pSOT memory device onto access transistors presents challenges that have become far more formidable with scaling. One such challenge is the need to is to accommodate several layers of interconnects between the transistor and the memory device. For practical concerns it may be advantageous to form a pSOT memory device architecture to include a SOT electrode structure whose height can be tuned depending on the thickness of the layers of interconnect but, where the spin orbit material (in contact with a free magnet of the pMTJ) has a thickness that may generate a large spin Hall current.

In accordance with embodiments of the present disclosure, an electrode structure includes a dielectric structure having sidewalls and a top surface. The dielectric structure has a width and a height, where the height exceeds the width in some examples. The electrode structure further includes an electrode including a spin orbit material adjacent to the dielectric structure. The electrode has a lateral electrode portion on the top surface of the dielectric structure, and one or more contiguous vertical electrode portions adjacent to vertical sidewalls of the dielectric structure. The electrode structure further includes a conductive interconnect in contact with the vertical electrode portion adjacent to a vertical sidewall of the dielectric structure.

A perpendicular magnetic junction device is coupled with the electrode portion on the top surface of the dielectric structure. The MTJ device includes a free magnet, a fixed magnet above the free magnet. The MTJ device further includes a layer between the fixed magnet and the free magnet and a second electrode coupled with the fixed magnet. In an embodiment, the magnetic junction device is a perpendicular magnetic tunnel junction (pMTJ) device having magnetization directions of the fixed and free magnets that are orthogonal to a lateral cross-sectional plane of device. In some such embodiments, the layer is a tunnel barrier. A large collection of such pMTJ devices, where each pMTJ device is coupled to an electrode structure, may be assembled to fabricate a high-density memory array.

FIG. 1A is an illustration of a cross-sectional view of a memory device 100A and an adjacent memory device 100B separated by a distance $W_s$, in accordance with an embodiment of the present disclosure. In an embodiment, the memory device 100A is a spin orbit memory torque memory (SOT) device 100A and, the memory device 100B is a spin orbit memory torque memory (SOT) device 100B.

The SOT memory device 100A includes an electrode structure 150. The electrode structure 150 includes a dielectric structure 106 having a first sidewall 106A, a sidewall 106B opposite to the first sidewall 106A, a top surface 106C adjacent and orthogonal to each of the first sidewall 106A and the second sidewall 106B. The electrode structure 150 further includes an electrode 101 adjacent to the dielectric structure 106, where the electrode 101 has a first electrode portion 101A on the top surface, a second electrode portion 101B adjacent to the first sidewall 106A and a third electrode portion 101C adjacent to the second sidewall 101B. As shown, the electrode portion 101A, is substantially orthogonal to and contiguous with both the electrode portion 101B and the electrode portion 101C. The electrode 101 includes a spin orbit material and is, herein, referred to as a spin orbit torque (SOT) electrode 101. The electrode structure 150 further includes a conductive interconnect 103A above a substrate 122. In the illustrative embodiment, the conductive interconnect 103A is in contact with a lateral extension of the electrode portion 101B and is adjacent to a dielectric material 120. In other embodiments (not illustrated), the conductive interconnect 103A is covered by the dielectric structure 106 and not in contact with the SOT electrode 101.

As shown, the dielectric structure 106 has a height, $H_D$, defined along a Y-direction and a width, $W_{D1}$, defined along the X-direction. $H_D$ may be defined by architectural requirements. For example, $H_D$, may be substantially equal to a thickness of conductive interconnects that are elements of a different circuit structure but located laterally at the same level in above the substrate 122. In an embodiment, $H_D$, is between 40 nm and 100 nm. In an embodiment, $W_{D1}$ is between 5 nm and 50 nm.

The electrode portion 101A also has a thickness, $T_{E1}$, along the Y-direction and a width, $W_{SOT1}$ along the X-direction, as shown. $W_{SOT1}$ is greater than $W_{D1}$. The electrode portions 101B and 101C each have thickness, $T_{E2}$ defined along the X-direction. In an embodiment, $T_{E1}$ is substantially equivalent to $T_{E2}$ In some such embodiments, $T_{E1}$ and $T_{E2}$ are each between 2 nm and 15 nm. In other embodiments, $T_{E1}$ is greater than $T_{E2}$. In some such embodiments, $T_{E1}$ is at least 3 nm and $T_{E2}$ is at least 2 nm. In an embodiment, $W_{D1}$ is at least 20 times greater than $T_{E1}$. The electrode portions 101A has a width, $W_{SOT1}$ is substantially equivalent to a combined thickness of the width, $W_{D1}$, of the dielectric structure 106 and thicknesses $T_{E2}$ of each of the electrode portions 101B and 101C.

As shown, the electrode portions 101B and 101C each have a lateral extension extending away from the sidewalls 106A and 106B, respectively. The lateral extensions of electrode portions 101B and 101C have a width, $W_L$ that are between 2 nm and 10 nm greater than $T_{E2}$. The lateral extensions of the electrode portions 101B and 101C are designed to cover an underlying conductive interconnect, when the conductive interconnect is not covered by the dielectric structure. In the illustrative embodiment, the lateral extension of the electrode portion 101B covers the conductive interconnect 103A that is not covered by the dielectric structure 106. The lateral extensions of the electrode portions 101B and 101C may have a thickness (in Y-direction) that is different from $T_{E1}$. For example, lateral extensions of each of the electrode portions 101B and 101C may have a thickness (in Y-direction) that is less than $T_{E1}$.

The memory device 100A further includes a magnetic junction device 104A on at least a portion of the top surface of the SOT electrode portion 101A. In the illustrative embodiment, the magnetic junction device 104A is a perpendicular magnetic tunnel junction (pMTJ) device. As shown, the pMTJ device 104A includes a free magnet 110, a tunnel barrier 112 on the free magnet 110, and a fixed magnet 114 on the tunnel barrier 112. In the illustrative embodiment, the pMTJ device 104A further includes a SAF structure 116 on the fixed magnet 114 and a top electrode 118 on the SAF structure 116. The memory device 100 further includes a metallization interconnect 124 coupled with the top electrode 118. In the illustrative embodiment, the metallization interconnect 124 coupled with the pMTJ device 104A and the conductive interconnect 103A coupled with electrode 101B makes SOT memory device 100A a two-terminal device. During operation current flows between metallization interconnect 124 and the conductive interconnect 103A to generate an STT current and a spin Hall current.

The pMTJ device 104A has a width, $W_{MTJ1}$ along the X-direction, as shown. In the illustrative embodiment, $W_{MTJ1}$ is substantially equal to $W_{SOT1}$. In other embodiments, $W_{MTJ1}$ is larger or smaller than $W_{SOT1}$.

Referring again to FIG. 1A, the second memory device 100B is a SOT memory device 100B and includes one or more features of the SOT memory device 100A. SOT memory device 100B includes an electrode structure 160 that has one or more features of the electrode structure 150. The electrode structure 160 includes a dielectric structure 108 having a first sidewall 108A, a sidewall 108B opposite to the first sidewall 108A, a top surface 108C adjacent and orthogonal to each of the sidewall 108A and the sidewall 108B. The electrode structure 160 further includes an electrode 102 adjacent to the dielectric structure 108, where the electrode 102 has a first electrode portion 102A on the top surface, a second electrode portion 102B adjacent to the first sidewall 108A and a third electrode portion 102C adjacent to the second sidewall 102B. As shown, the electrode portion 102A, is substantially orthogonal to and contiguous with both the electrode portion 102B and the electrode portion 102C. The electrode 102 includes a spin orbit material and is, herein, referred to as a spin orbit torque (SOT) electrode 102. In an embodiment, the SOT electrode 102 includes a same material as the material of the SOT electrode 101. The electrode structure 160 further includes a conductive interconnect 103B above a substrate 122. In the illustrative embodiment, the conductive interconnect 103B is in contact with a lateral extension of the electrode portion 102B and is adjacent to a dielectric material 120.

As shown, the dielectric structure 106 has a height, $H_D$, defined along a Y-direction and a width, $W_{D2}$, defined along the X-direction. $H_D$ may be defined by architectural requirements. It is to be appreciated that the height, $H_D$, of the dielectric structure 108 may be the same or substantially the same as the height, $H_D$, of the dielectric structure 106. In an embodiment, $H_D$, is between 40 nm and 100 nm. In an embodiment, $W_{D2}$ is between 5 nm and 50 nm. In some embodiments, the width, $W_{D2}$, of the dielectric structure 108 may be the same or substantially the same as the width, $W_{D1}$, of the dielectric structure 106. In other embodiments, the width, $W_{D2}$, of the dielectric structure 108 may be greater or less than the width, $W_{D1}$, of the dielectric structure 106. In an embodiment, $W_{D2}$ is between 5 nm and 50 nm.

The electrode portion 102A also has a thickness, $T_{E1}$, along the Y-direction and a width, $W_{SOT2}$ along the X-direction, as shown. $W_{SOT2}$ is greater than $W_{D2}$ The electrode portions 102B and 102C each have thickness, $T_{E2}$ defined along the X-direction. In an embodiment, $T_{E1}$ is substantially equivalent to $T_{E2}$. In some such embodiments, $T_{E1}$ and $T_{E2}$ are each between 2 nm and 15 nm. In other embodiments, $T_{E1}$ is greater than $T_{E2}$. In some such embodiments, $T_{E1}$ is at least 3 nm and $T_{E2}$ is at least 2 nm. In an embodiment, $H_D$ is at least 20 times greater than $T_{E1}$. The electrode portions 102A has a width, $W_{SOT2}$ is substantially equivalent to a combined thickness of the width, $W_{D2}$, of the dielectric structure 106 and thicknesses $T_{E2}$ of each of the electrode portions 102B and 102C.

As shown, the electrode portions 102B and 102C each have a lateral extension extending away from the sidewalls 108A and 108B, respectively. The lateral extensions of electrode portions 102B and 102C have a width, $W_L$ that are between 2 nm and 10 nm greater than $T_{E2}$. The lateral extensions of the electrode portions 102B and 102C are designed to cover an underlying conductive interconnect, when the conductive interconnect is not covered by the dielectric structure. In the illustrative embodiment, the lateral extension of the electrode portion 102B covers the conductive interconnect 103B that is not covered by the dielectric structure 108. The lateral extensions of the electrode portions 102B and 102C may have a thickness (in Y-direction) that is different from $T_{E1}$. For example, lateral extensions of each of the electrode portions 102B and 102C may have a thickness that is less than $T_{E1}$.

The memory device 100B further includes a magnetic junction device 104B on at least a portion of the top surface of the SOT electrode portion 102A. In the illustrative embodiment, the magnetic junction device 104B is a perpendicular magnetic tunnel junction (pMTJ) device. As shown, the pMTJ device 104B includes a free magnet 110, a tunnel barrier 112 on the free magnet 110, and a fixed magnet 114 on the tunnel barrier 112. In the illustrative embodiment, the pMTJ device 104B further includes a SAF structure 116 on the fixed magnet 114 and a top electrode 118 on the SAF structure 116. The memory device 100 further includes a metallization interconnect 126 coupled with the top electrode 118. In the illustrative embodiment, the metallization interconnect 126 coupled with the pMTJ device 104B and a single conductive interconnect such as conductive interconnect 103B coupled with electrode 102B makes SOT memory device 100B, a two-terminal device.

The pMTJ device 104B has a width, $W_{MTJ2}$ along the X-direction, as shown. In the illustrative embodiment, $W_{MTJ2}$ is substantially equal to $W_{SOT2}$. In an embodiment, $W_{MTJ2}$ is the same or substantially the same as $W_{MTJ1}$. In other embodiments, $W_{MTJ2}$ is larger or smaller than $W_{MTJ1}$.

A top surface of the SOT electrode portion 101A is in contact with a lowermost surface of the free magnet 110 of pMTJ 104A. In an embodiment, the top surface of the SOT electrode portion 101A has an area that is greater than an area of the lowermost surface of the free magnet 108, such as is shown in the plan view illustration in FIG. 1B. Similarly, a top surface of the SOT electrode portion 102A is in contact with a lowermost surface of the free magnet 110 of pMTJ 104B. In an embodiment, the top surface of the SOT electrode portion 102A has a plan-view area that is greater than a plan-view area of the lowermost surface of the free magnet 108, such as is shown in the plan view illustration in FIG. 1B. In other embodiments, the top surface of the SOT electrode portion 102A has an area that is substantially the same as the area of the lowermost surface of the free magnet 108.

Also shown is the relative plan-view shape of the pMTJ device 104A and 104B compared to a plan-view shape of the SOT electrode portions 101A and 102A, respectively. In some examples, as shown, the pMTJ 104A and 104B each have a circular plan-view profile and the SOT electrode portions 101A and 102A each have a square cross-sectional plan-view profile. In some such embodiments, $W_{MTJ1}$ is also a diameter of the pMTJ device 104A and the SOT electrode portion 101A has a dimension along the Z-direction that is substantially equal to $W_{MTJ1}$ which may advantageously provide for a high SOT current in the SOT memory device 100A. Similarly, in some such embodiments, $W_{MTJ2}$ is also a diameter of the pMTJ device 104B and the SOT electrode portion 102A has a dimension along the Z-direction that is substantially equal to $W_{MTJ2}$ which may advantageously provide for a high SOT current in the SOT memory device 100B.

In an embodiment, the pMTJ device 104A has a center, $C_{MTJ1}$ and the electrode portion 101A has a center, $C_{SOT1}$, as illustrated. In an embodiment, the pMTJ device 104B has a center, $C_{MTJ2}$ and the electrode portion 102A has a center, $C_{SOT2}$, also as illustrated. In an embodiment, $C_{MTJ1}$ is aligned to $C_{SOT1}$ and $C_{MTJ2}$ is aligned to $C_{SOT2}$ in X and Z directions, as is illustrated. In another embodiment, $C_{MTJ}$ is misaligned from $C_{SOT1}$ and $C_{MTJ2}$ is misaligned from $C_{SOT2}$ in X and Z directions, (not shown). Misalignment may range between 2 nm and 10 nm. It is to be appreciated that when $C_{MTJ1}$ is misaligned from $C_{SOT1}$, then $C_{MTJ2}$ is misaligned from $C_{SOT2}$ by a substantially similar amount.

Referring again to FIG. 1A, the SOT memory device 100A and 100B are separated by a distance $W_S$. The separation may be as small as 10 nm to enable an array of high density of SOT memory devices such as SOT memory devices 100A and 100B.

In an embodiment, the spin orbit material includes a metal with high degree of spin orbit coupling (SOC). A metal with a high degree of SOC has an ability to inject a large spin polarized current in to a free magnet 110 of the pMTJ device 104A or pMTJ device 104B. In an embodiment, the SOT electrodes 101 and 102 each include a spin orbit material such as but not limited to tantalum, tungsten, platinum or gadolinium, β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. When the SOT electrodes 101 and 102 include a beta phase tantalum or beta phase tungsten, the SOT electrodes 101 and 102 have a high spin hall efficiency. With a high spin hall efficiency, the SOT electrodes 101 and 102 can generate a large spin hall current for a given charge current that is passed through the SOT electrode 101 and 102, respectively.

In another embodiment, the SOT electrodes 101 includes a spin orbit material that is different from a spin orbit material of the SOT electrode 102.

In an embodiment, the free magnet 110 includes a magnetic material such as Co, Ni, Fe or alloys of these materials. In an embodiment, the free magnet 110 includes a magnetic material such as CoB, FeB, CoFe or CoFeB. In some embodiments, the free magnet 110 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 110 is FeB, where the concentration of boron is between 10 and 40 atomic percent of the total composition of the FeB alloy. In an embodiment, the free magnet 110 includes a magnetic material such as Co, Ni, Fe or alloys of these materials. In an embodiment, the free magnet 110 includes a magnetic material such as CoB, FeB, CoFe or CoFeB. In some embodiments, the free magnet 110 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 110 is FeB, where the concentration of boron is between 10 and 40 atomic percent of the total composition of the FeB alloy. In an embodiment, the free magnet 110 and the free magnet 110 include $Co_{100-x-y}Fe_xB_y$, where X and Y each represent atomic percent, further where X is between 50 and 80 and Y is between 10 and 40, and further where the sum of X and Y is less than 100. In one example, the free magnet 110 may have a thickness between 0.5 nm and 2.0 nm for pMTJ devices.

In an embodiment, tunnel barrier 112 includes a material suitable for allowing electron current having a majority spin to pass through tunnel barrier 112, while impeding, at least to some extent, electron current having a minority spin from passing through tunnel barrier 112. Thus, tunnel barrier 112 (or spin filter layer) may also be referred to as a tunneling layer for electron current of a particular spin orientation. In an embodiment, tunnel barrier 112 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 112 including MgO has a crystal orientation that is (001) and is lattice matched to free magnet 110 below tunnel barrier 112 and fixed magnet 114 above tunnel barrier 112. In an embodiment, tunnel barrier 112 is MgO and has a thickness in the range of 1 nm to 3 nm. In an embodiment, a free magnet 110 including a $Co_{100-x-y}Fe_xB_y$, is highly lattice matched to the tunnel barrier 112 including an MgO. Lattice matching between a crystal structure of the free magnet 110 and the tunnel barrier 112 enables a higher tunneling magnetoresistance (TMR) ratio in the pMTJ device 104.

In some embodiments, the fixed magnet 114 includes a material and has a thickness sufficient for maintaining a fixed magnetization. In an embodiment, the fixed magnet 114 of the pMTJ device 104 includes an alloy such as CoFe or CoFeB. In an embodiment, the fixed magnet 114 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 114 is FeB, where the concentration of boron is between 10 and 40 atomic percent of the total composition of the FeB alloy. In an embodiment the fixed magnet 114 has a thickness that is between 1 nm and 3 nm.

Figure 1B:
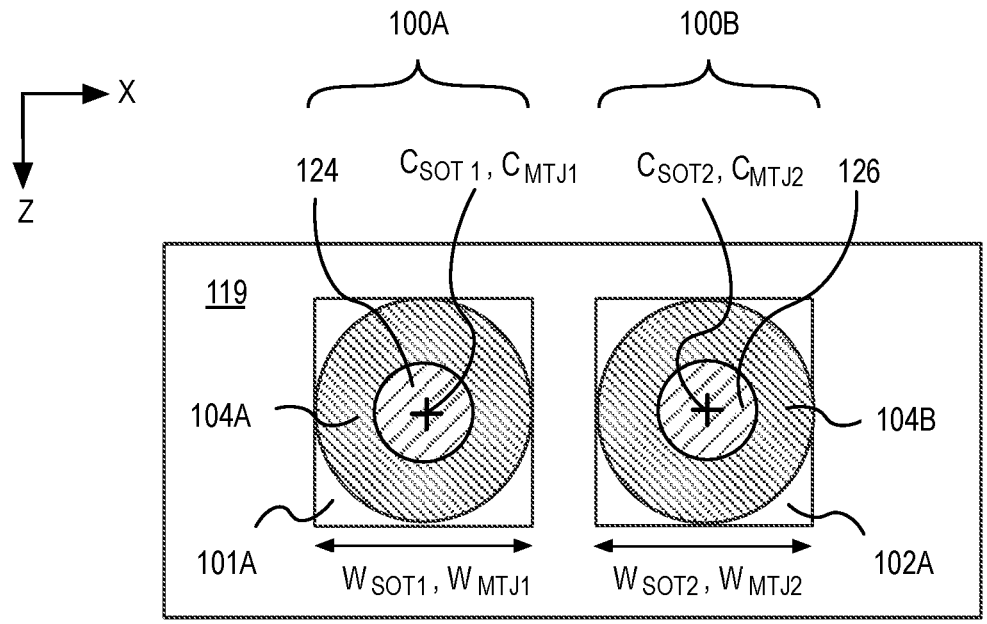
FIG. 1B illustrates a plan view of a pair of two terminal spin orbit torque (SOT) memory devices, in accordance with an embodiment of the present disclosure.
Figure 1C:
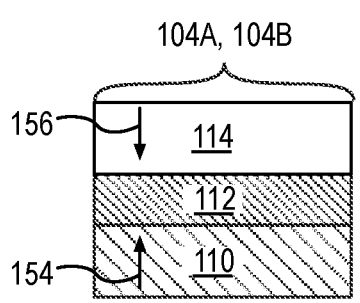
FIG. 1C illustrates a cross-sectional view depicting the direction of magnetization in a free magnet relative to the direction of magnetization in a fixed magnetic layer, in accordance with an embodiment of the present disclosure.

FIG. 1C illustrates a cross-sectional view depicting the free magnet 110 of the pMTJ device 104 having a direction of magnetization (denoted by the direction of the arrow 154) that is anti-parallel to a direction of magnetization (denoted by the direction of the arrow 156) in the fixed magnet 114. When the direction of magnetization 154 in the free magnet 110 is opposite (anti-parallel) to the direction of magnetization 156 in the fixed magnet 114, the pMTJ device 104 device is said to be in a high resistance state.

Figure 1D:
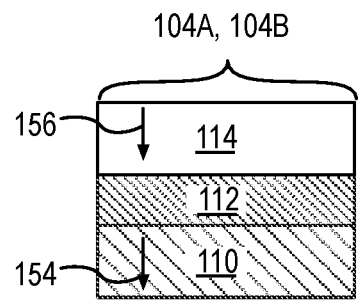
FIG. 1D illustrates a cross-sectional view depicting the direction of magnetization in a free magnet relative to the direction of magnetization in a fixed magnetic layer, in accordance with an embodiment of the present disclosure.

Conversely, FIG. 1D illustrates a cross-sectional view depicting the free magnet 110 of the pMTJ device 104 having a direction of magnetization (denoted by the direction of the arrow 154) that is parallel to a direction of magnetization (denoted by the direction of the arrow 156) in the fixed magnet 114. When the direction of magnetization 154 in the free magnet 110 is parallel to the direction of magnetization 156 in the fixed magnet 114, the pMTJ device 104 is said to be in a low resistance state.

In an embodiment, the free magnet 110 and the fixed magnet 114 can have approximately similar thicknesses. Injected spin polarized current that changes the direction of the magnetization 154 in the free magnet 110 can also affect the magnetization 156 of the fixed magnet 114. In an embodiment, to make the fixed magnet 114 more resistant to accidental flipping, the fixed magnet 114 has a higher magnetic anisotropy than the free magnet 110. In another embodiment, the pSOT memory device 104 includes a synthetic antiferromagnetic (SAF) structure 116 above the fixed magnet 114 to deter accidental flipping of the magnetization 156 in the fixed magnet 114 as illustrated in FIG. 1A.

Figure 1E:
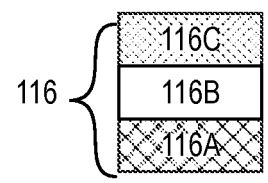
FIG. 1E illustrates a cross-sectional view of individual layers of a synthetic antiferromagnetic structure, in accordance with an embodiment of the present disclosure.

FIG. 1E illustrates cross-sectional view of the SAF structure 116 in an accordance of an embodiment of the present invention. In an embodiment, the SAF structure 116 includes a non-magnetic layer 116B between a first pinning ferromagnet 116A and a second pinning ferromagnet 116C as depicted in FIG. 1D. The first pinning ferromagnet 116A and the second pinning ferromagnet 116C are anti-ferromagnetically coupled to each other. In an embodiment, the first pinning ferromagnet 116A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 116B includes a ruthenium or an iridium layer. In an embodiment, the pinning ferromagnet 116C includes a layer of a magnetic metal comprising Fe, Co or Ni. Exemplary alloys include CoFe or CoFeB. Other magnetic alloys of one or more of Co, Ni, Fe are also possible, as is a bilayer structure including a magnetic/non-magnetic metal such but not limited to Co/Pd or a Co/Pt. In an embodiment, a ruthenium based non-magnetic layer 116B has a thickness between 0.3 nm and 1.0 nm to ensure that the coupling between the pinning ferromagnet 116A and the pinning ferromagnet 116C is anti-ferromagnetic in nature.

An additional layer of non-magnetic spacer layer may be between the fixed magnet 114 and the SAF structure 116 (not illustrated in FIG. 1A), which may improve coupling between the SAF structure 116 and the fixed magnet 114. In an embodiment, the non-magnetic spacer layer may include a metal such as Ta, Ru or Ir.

Referring again to FIG. 1A, in an embodiment, the top electrode 118 includes a material such as Ta or TiN. In an embodiment, the top electrode 118 has a thickness between 5 nm and 70 nm.

In an embodiment, the conductive interconnects 103A and 103B each include a barrier layer, such as tantalum and nitrogen (such for e.g., tantalum nitride) or ruthenium and a fill metal, such as copper, tungsten or cobalt. In an embodiment, metallization interconnect 124 and 126 each include a barrier layer, such as tantalum and nitrogen (such for e.g., tantalum nitride) or ruthenium, and a fill metal, such as copper, tungsten or cobalt.

In an embodiment, dielectric structure includes silicon and one or more of oxygen or nitrogen. In an embodiment, the dielectric material 119 includes silicon and at least one of oxygen or nitrogen. In an embodiment, the dielectric material 120 includes silicon and at least one of oxygen or nitrogen. Dielectric material 119 and 120 may include a same material. In other examples, dielectric material 119 and 120 may include a same material but different from the material of the dielectric structure 106 and/or 108.

In an embodiment, the substrate 122 includes a suitable semiconductor material such as but not limited to, single crystal silicon, polycrystalline silicon and silicon on insulator (SOI). In another embodiment, substrate 122 includes other semiconductor materials such as germanium, silicon germanium or a suitable group III-N or a group III-V compound. Logic devices such as MOSFET transistors and access transistors and may be formed on the substrate 122. Logic devices such as access transistors may be integrated with memory devices such as SOT memory device 100A and 100B to form embedded memory. Embedded memory including SOT memory devices and logic MOSFET transistors may be combined to form functional integrated circuit such as a system on chip.

Figure 1F:
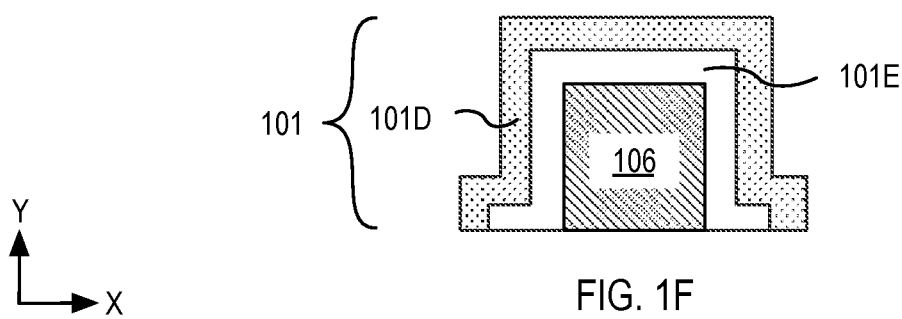
FIG. 1F illustrates a cross-sectional view of a dual layer electrode on a dielectric structure, in accordance with an embodiment of the present disclosure.

In other embodiments, the SOT electrode 101 includes a first SOT electrode layer 101E directly adjacent to the dielectric structure 106 and a second SOT electrode layer 101D adjacent to the SOT electrode layer 101E as illustrated in FIG. 1F. When SOT electrode 101 includes SOT electrode layers 101D and layer 101E, layer 101D includes a material that is different from a material of the layer 101E. In an embodiment, SOT electrode layers 101D and 101E each include two distinct spin orbit materials such as the spin orbit material of electrode 101, described above. In another embodiment, SOT electrode layers 101D and 101E each include combinations of one or more spin orbit materials (such as spin orbit material of electrode 101) but are still two distinct layers.

Figure 1G:
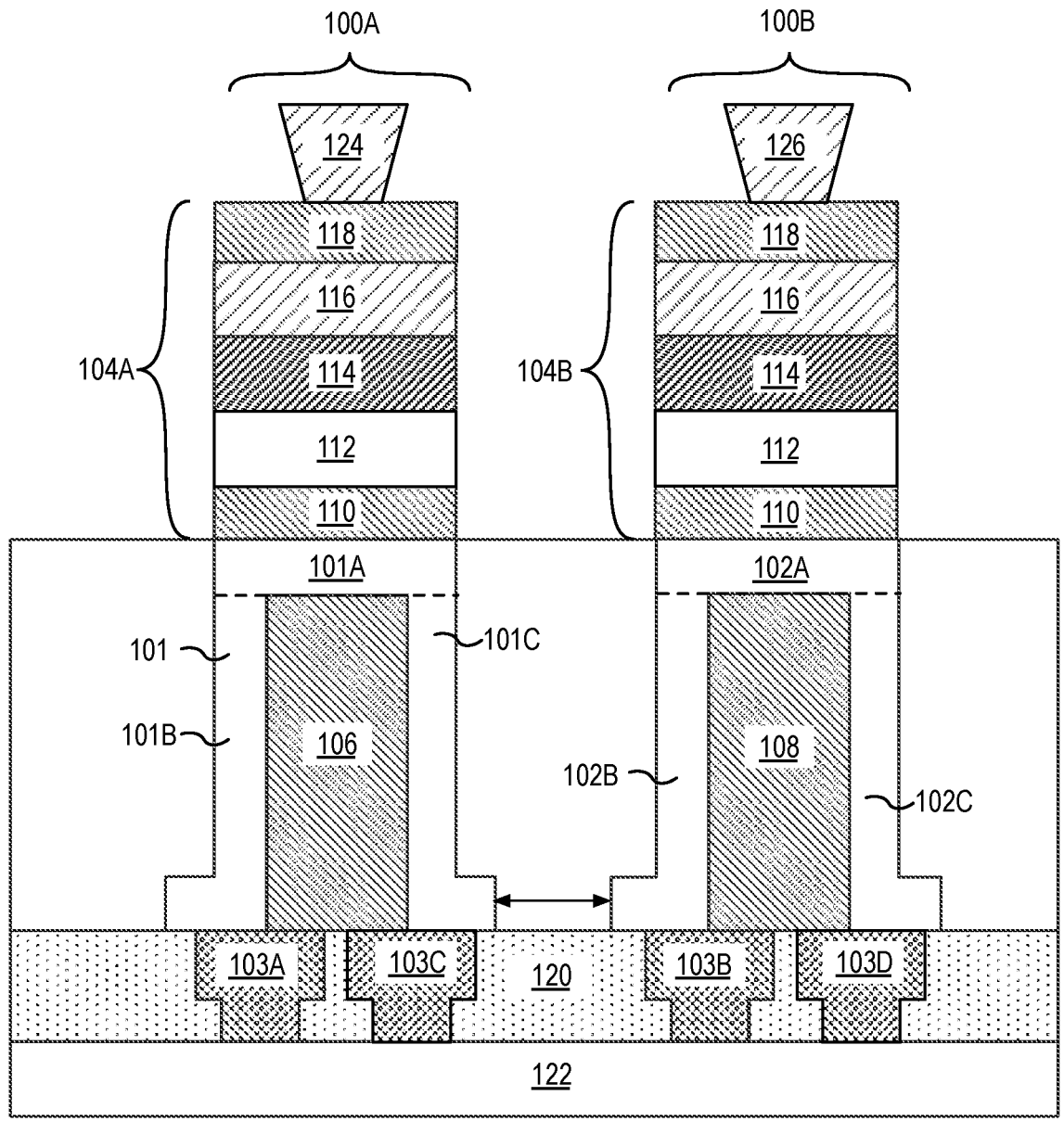
FIG. 1G illustrates a cross-sectional view of a pair of three terminal spin orbit torque (SOT) memory devices, in accordance with an embodiment of the present disclosure.

FIG. 1G illustrates a cross-sectional view of a pair of three terminal spin orbit torque (SOT) memory devices 100A and 100B, in accordance with an embodiment of the present disclosure.

In the illustrative embodiment, a conductive interconnect 103C is coupled with SOT electrode portion 101C. The conductive interconnect 103C is not coupled with the conductive interconnect 103A. In some embodiments, conductive interconnect 103A and conductive interconnect 103C are within the dielectric structure 106. The presence of an extra independent conductive interconnect such as conductive interconnect 103C provides a means to generate spin Hall current in the electrode 101A by applying a potential difference between conductive interconnects 103A and 103C. The spin Hall current may be generated in electrode 101A independently of voltage biasing of interconnect metallization 124.

In the illustrative embodiment, a conductive interconnect 103D is coupled with and SOT electrode portion 102C. The conductive interconnect 103D is not coupled with the conductive interconnect 103B. In some embodiments, conductive interconnect 103B and conductive interconnect 103D are within the dielectric structure 108. The presence of an extra independent conductive interconnect such as conductive interconnect 103D provides a means to generate spin Hall current in the electrode 102A by applying a potential difference between conductive interconnects 103B and 103D. The spin Hall current may be generated in electrode 102A independently of voltage biasing of interconnect metallization 126. It is to be appreciated that the direction of the spin Hall current generated in each of the SOT electrodes 101 and 102 may be independently chosen providing operational flexibility.

It is to be appreciated that while FIG. 1F illustrates a pair of three-terminal memory devices, other configurations are also possible. For example, memory device 100A may be a two terminal memory device and memory device 100B may be a three terminal memory device, or vice versa. In other embodiments, a bridging structure physically couples the conductive interconnect 103C with the conductive interconnect 103B.

Figure 1H:
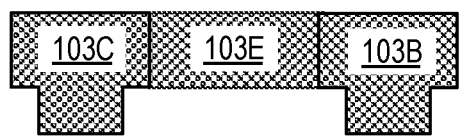
FIG. 1H illustrates a cross-sectional view of a pair of conductive interconnects in contact with an interconnect coupler.

FIG. 1H illustrates a cross-sectional view of a pair of conductive interconnects in contact with an interconnect coupler. In the illustrative embodiment, conductive interconnect 103C and 103B are adjacent to and each coupled with an interconnect coupler 103E. The presence of an interconnect coupler permits SOT electrodes 101 and 102 to be operated simultaneously by a common power source. A common power source may provide power advantage and space saving for additional interconnect terminals in the circuit. When an interconnect coupler 103E is coupled with conductive interconnect 103C and 103B, the spin Hall current may be generated in the same direction in each of the SOT electrodes 101 and 102 (each having a same spin orbit material), during operation. In some examples, when SOT electrodes 101 and 102 include materials having a positive and a negative spin Hall angle respectively In other embodiments, the width, $W_{SOT1}$, $W_{SOT2}$, may be controlled independently of the width of the dielectric structures 106 and 108, respectively.

Figure 2:
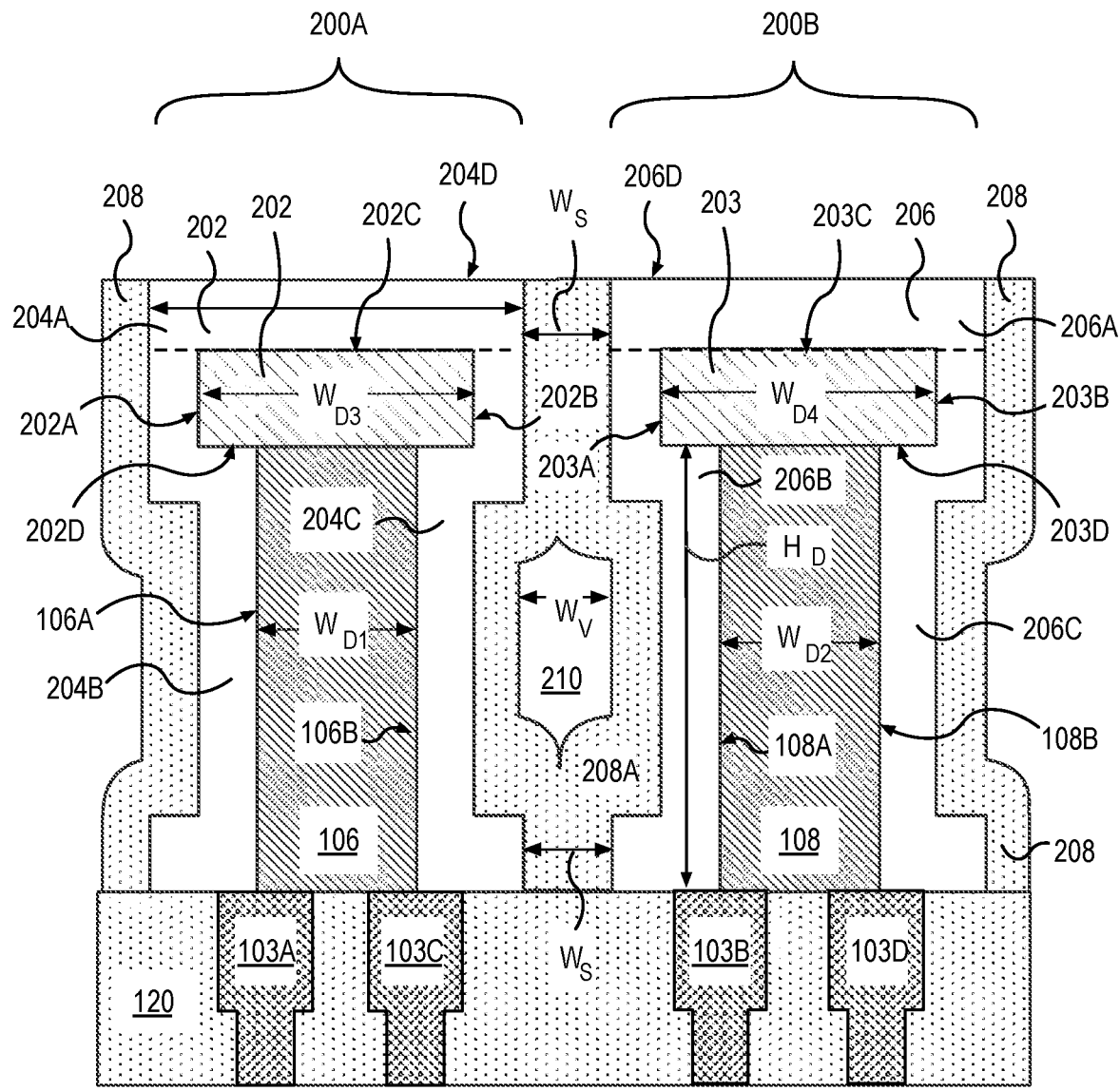
FIG. 2 illustrates a cross-sectional view of a pair of two terminal spin orbit torque (SOT) memory devices with an air gap in between, in accordance with an embodiment of the present disclosure.

FIG. 2 illustrates a cross-sectional view of the pair of electrode structures, in accordance with an embodiment of the present disclosure. As shown, an electrode structure 200A includes dielectric structure 106 and a dielectric structure 202 on the dielectric structure 106. In the illustrative embodiment, dielectric structure 202, has a width $W_{D3}$, that is greater than a width $W_{D1}$ of the dielectric structure 106. In some embodiments $W_{D3}$ is greater than $W_{D1}$ by 5 nm to 20 nm. The dielectric structure 202 may include a material that is different from the material of the dielectric structure 106. In an embodiment, the dielectric structure 202 includes silicon and one or more of carbon, oxygen or nitrogen.

The electrode structure 200A includes a SOT electrode 204 having a portion 204A that is on a top surface 202C of the dielectric structure 202. The SOT electrode 204 further includes a SOT electrode portion 204B on sidewall 202A, portion of bottom surface 202D and on sidewall 106A, as illustrated. The SOT electrode 204 further includes a SOT electrode portion 204C on sidewall 202B, on a portion of bottom surface 202D, and on sidewall 106B, as illustrated. The SOT electrode portions 204A, 204B and 204C are contiguous. In an embodiment, the SOT electrode 204 includes a material that is the same or substantially the same as the spin orbit material of SOT electrode 101.

A second electrode structure 200B is separated from SOT electrode structure 200A by a distance $W_S$. In an embodiment, the electrode structure 200B has one or more features of the electrode structure 200A. The electrode structure 200B includes a dielectric structure 108 and a dielectric structure 203 on the dielectric structure 108. The dielectric structure 203, has a width $W_{D4}$, that is greater than a width, $W_{D2}$ of the dielectric structure 108. In some embodiments $W_{D4}$ is greater than $W_{D2}$ by 5 nm to 20 nm. The dielectric structure 203 may include a material that is different from the material of the dielectric structure 108. In an embodiment, the dielectric structure 203 includes silicon and one or more of carbon, oxygen or nitrogen.

The electrode structure 200B includes a SOT electrode 206 having a SOT electrode portion 206A that is on a top surface 203C of the dielectric structure 203. The SOT electrode 206 includes a SOT electrode portion 206B on sidewall 203A, portion of bottom surface 203D and on sidewall 108A, as illustrated. The SOT electrode 206 further includes a SOT electrode portion 206C on sidewall 203B, on a portion of bottom surface 203D, and on sidewall 108B, as illustrated. The SOT electrode portions 206A, 206B and 206C are contiguous. In an embodiment, the SOT electrode 206 includes a material that is the same or substantially the same as the spin orbit material of SOT electrode 102.

A dielectric material 208 is adjacent to the SOT electrode structure 200A and SOT electrode structure 200B. A dielectric material portion 208A between the SOT electrode structure 200A and SOT electrode structure 200B includes a void 210. The void 210 is an artifact of a fabrication process obtained during a process utilized to deposit dielectric material 208. The void 210 has a size that is determined by the spacing, $W_S$. $W_S$ may be as small as 3 nm. In some examples, the void 210 may have a maximum width, $W_V$, that may be half as much as $W_S$. In some embodiments, $W_S$ is comparable to a height, $H_D$, of the dielectric structure 106 and/or dielectric structure 108. In some such embodiments, the dielectric material does not have a void 210.

As shown, the electrode structure 200A is coupled by two conductive interconnects 103A and 103C. In other embodiments, electrode structure 200A is coupled by either a conductive interconnect 103A or a conductive interconnect 103C. Also, as shown the electrode structure 200B is coupled by two conductive interconnects 103B and 103D. In other embodiments, SOT electrode structure 200B is coupled by either a conductive interconnect 103B or a conductive interconnect 103D.

As discussed above, in some embodiments, when electrode structure 200A is coupled by two conductive interconnects 103A and 103C and electrode structure 200B is coupled by two conductive interconnects 103B and 103D, an interconnect coupling structure may be adjacent and in contact with each of the conductive interconnects 103C and 103B.

A memory array may include a plurality of SOT electrode structures such as a plurality of electrode structures 200A and 200B. A pMTJ device such as pMTJ device 104A may be coupled on a top surface 204D of each SOT electrode structure 200A and a pMTJ device such as pMTJ device 104B may be coupled on a top surface 206D of each SOT electrode structure 200B of the memory array.

Figure 3A:
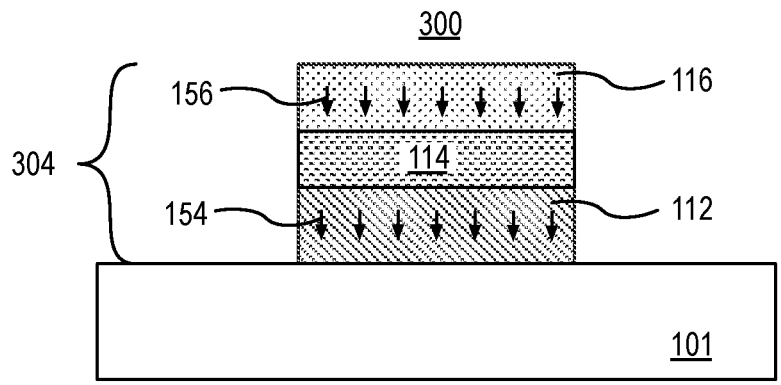
FIG. 3A illustrates a SOT memory device in a low resistance state.
Figure 3B:
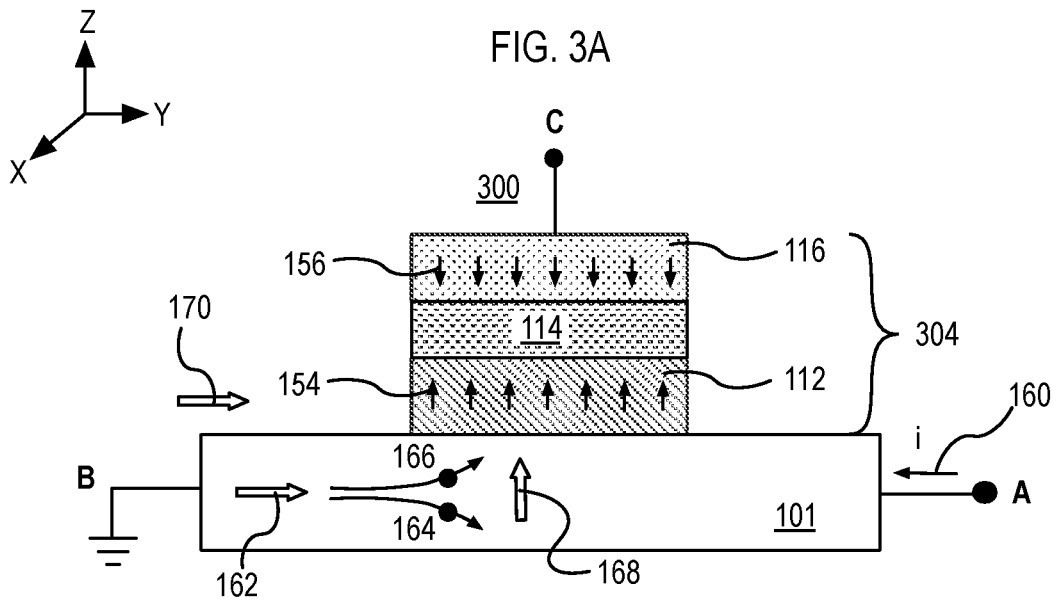
FIG. 3B illustrates a SOT memory device switched to a high resistance state after the application of a spin Hall current and an external magnetic field.
Figure 3C:
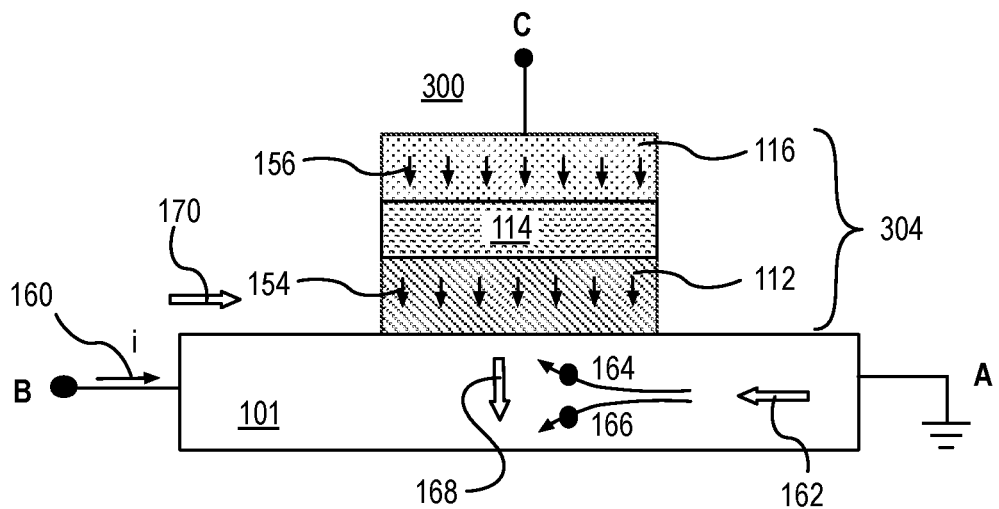
FIG. 3C illustrates a SOT memory device switched to a low resistance state after the application of a spin Hall current and an external magnetic field.

FIGS. 3A-3C illustrate a mechanism for switching a spin orbit torque (SOT) memory device such as a spin orbit torque (SOT) memory device 300 including a pMTJ device 304 on the electrode 101 including a spin orbit torque material. In the illustrative embodiment, the pMTJ device 304 includes one or more features of the pMTJ device 104 (FIG. 1A), such as the free magnet 110, the fixed magnet 114 and the tunnel barrier 112 between the free magnet 110, the fixed magnet 114.

FIG. 3A illustrates a pSOT memory device 300 including the pMTJ device 304 on the electrode 101, where a magnetization 154 of the free magnet 110 is aligned in a direction parallel to the magnetization 156 of the fixed magnet 114. In an embodiment, the direction of magnetization 154 of the free magnet 110 and the direction of magnetization 156 of the fixed magnet 114 are both in the negative Z-direction as illustrated in FIG. 3A. As discussed above, when the magnetization 154 of the free magnet 110 is in the same direction as a magnetization 156 of the fixed magnet 114, pMTJ device 104 (FIG. 1A), is in a low resistance state.

FIG. 3B illustrates the pMTJ device 304 of the spin orbit torque (SOT) memory device 300 switched to a high resistance state. In an embodiment, a reversal in the direction of magnetization 154 of the free magnet 110 in FIG. 3B relative to the direction of magnetization 154 of the free magnet 110 in FIG. 3A is brought about by (a) inducing a spin diffusion current 168 in the electrode 101 in the Y-direction, (by applying a positive voltage bias on terminal A with respect to a grounded terminal B), and (b) by applying an external magnetic field, $H_y$, 170 in the Y-direction. In some examples, terminal A may be conductive interconnect 103A and terminal B may be conductive interconnect 103C, and terminal C may be an interconnect metallization structure 124.

In an embodiment, a charge current 160 is passed through the electrode 101 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the electrode 101. The spin dependent scattering phenomenon is brought about by a spin-orbit interaction between the nucleus of the atoms in the electrode 101 and the electrons in the electron current 162. The spin dependent scattering phenomenon causes type I electrons 166, whose spins are oriented in the negative x-direction (into the page of FIG. 3B), to be deflected upwards towards an uppermost portion of the electrode 101 and type II electrons 164 whose spins are oriented in the positive X-direction to be deflected downwards towards a lowermost portion of the electrode 101. The separation between the type I electrons 166 and the type II electrons 164 induces a polarized spin diffusion current 168 in the electrode 101. In an embodiment, the polarized spin diffusion current 168 is directed upwards toward the free magnet 110 of the pMTJ device 104, as is depicted in FIG. 3B. The polarized spin diffusion current 168 induces a Spin Hall torque on the magnetization 154 of the free magnet 110. In an embodiment, a torque can also be exerted on the magnetization 154 of the free magnet 110 by applying an external magnetic field, $H_y$, in the Y-direction, as illustrated in FIG. 3B. In the illustrative embodiment, the external magnetic field, $H_y$, provides a torque component (in the positive Z direction) to break symmetry and switch the magnetization 154 of the free magnet 110.

FIG. 3C illustrates the pMTJ device 304 of the spin orbit torque (SOT) memory device 300 switched to a low resistance state. In an embodiment, a reversal in the direction of magnetization 154 of the free magnet 110 in FIG. 3C compared to the direction of magnetization 154 of the free magnet 110 in FIG. 3B is brought about by (a) reversal in the direction of the spin diffusion current 168 in the electrode 101 (by applying a positive voltage bias on terminal B with respect to a grounded terminal A), and/or (b) by applying an external magnetic field, $H_y$, 170.

A read operation to determine a state of the MTJ device 104 may be performed by voltage biasing a third terminal C, connected to the fixed magnet 114 with respect to the either terminal and A and B, where the terminals A or B are grounded (not illustrated).

Figure 4:
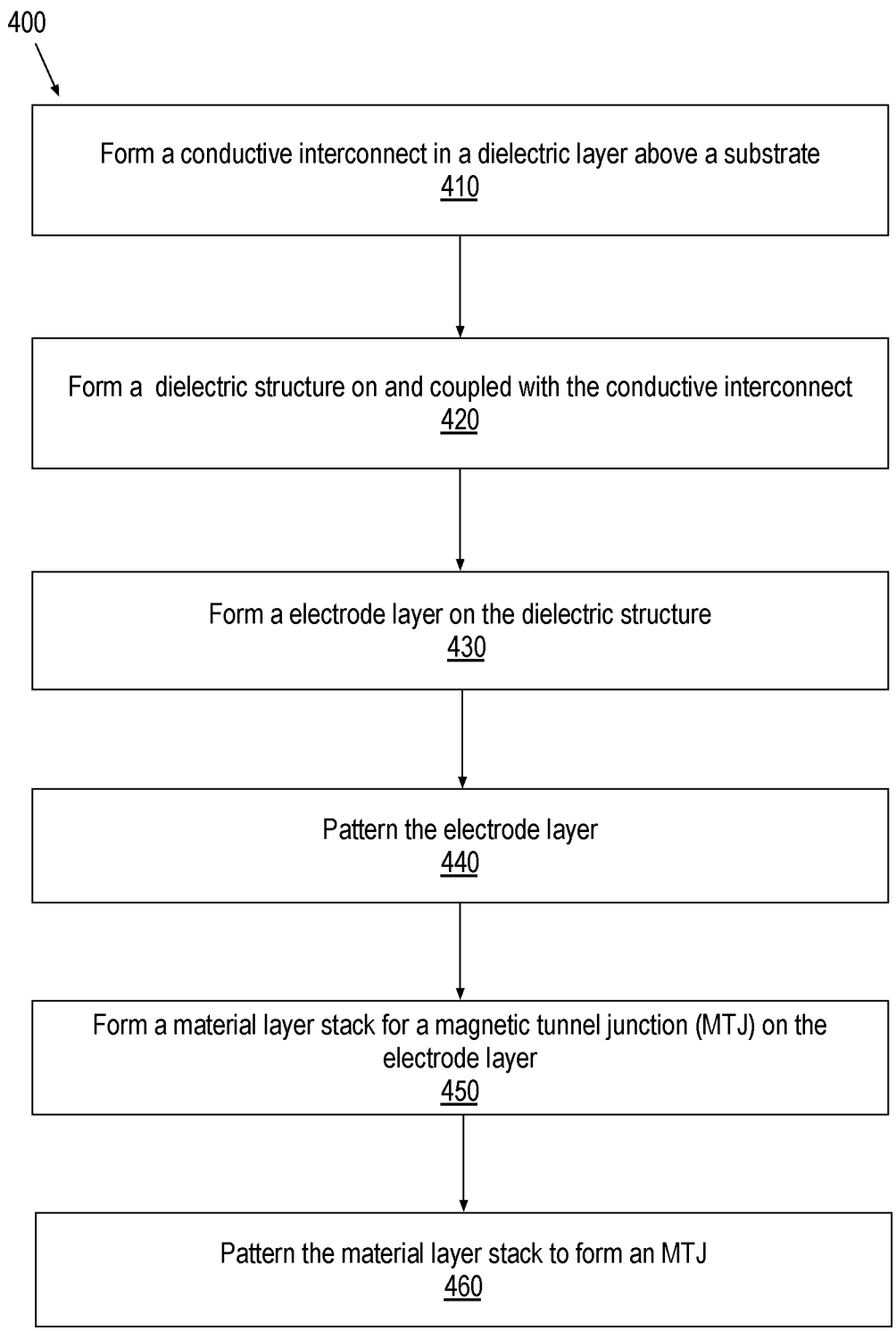
FIG. 4 illustrates a flow diagram for a method to fabricate a SOT device, in accordance with embodiments of the present disclosure.

FIG. 4 illustrates a flow diagram of a method to fabricate a memory device such as a memory device 100A. The method 400 begins at operation 410 by forming a conductive interconnect in a dielectric material above a substrate. The method 400 continues at operation 420 with the formation of a dielectric structure on and coupled with the conductive interconnect.

The method 400 continues at operation 430 with the formation of an electrode layer on the dielectric structure and portions of the conductive interconnect. The method 400 continues at operation 440 with the patterning of the electrode layer and forming the electrode layer on a top surface and on sidewalls of the dielectric structure. The method 400 continues at operation 450 with formation of a material layer stack on the electrode layer. The method 400 concludes at operation 460 with patterning of the material layer stack to form an MTJ device on the electrode.

FIGS. 5A-8B illustrate cross-sectional views of the pSOT memory devices 100A and 100B illustrated in FIG. 1A evolving as a fabrication method, such as method 400, is practiced.

Figure 5A:
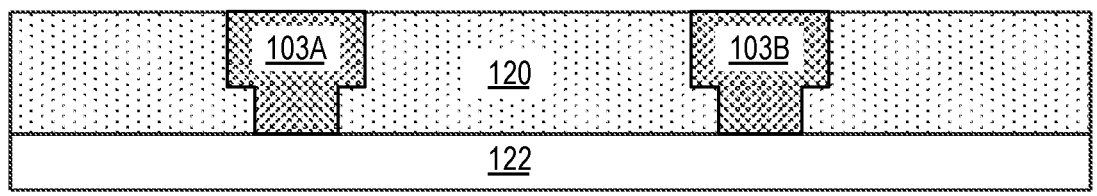
FIG. 5A illustrates a cross-sectional view following the formation of a pair of conductive interconnects, in accordance with an embodiment of the present disclosure.

FIG. 5A illustrates the structures of conductive interconnects 103A and 103B surrounded by a dielectric material 120 formed above a substrate 122. In an embodiment, the conductive interconnects 103A and 103B are formed in a dielectric material 500 by a damascene or a dual damascene process. In an embodiment, each of the conductive interconnects 103A and 103B includes a barrier layer, such as titanium nitride, ruthenium, tantalum, tantalum nitride, and a fill metal, such as copper, tungsten or cobalt. In an embodiment, the conductive interconnects 103A and 103B are fabricated using a subtractive etch process when materials other than copper are utilized. In one such embodiment, the conductive interconnects 103A and 103B include a material such as but not limited to titanium nitride, ruthenium, tantalum, tantalum nitride. In some examples, the dielectric material 500 includes a material such as but not limited to silicon dioxide, silicon nitride, silicon carbide, or carbon doped silicon oxide. In an embodiment, the dielectric material 500 has an uppermost surface substantially coplanar with an uppermost surface of the conductive interconnects 103A and 103B. The dielectric material 500 may include a material that is the same or substantially the same as the dielectric material 102 described above. Depending on embodiments, the dielectric material 500 has a total thickness between 70 nm-120 nm. In some examples, at least one of the conductive interconnects 103A and 103B is electrically connected to a circuit element such as an access transistor (not shown). Logic devices such as access transistors may be integrated with memory devices such as a SOT device to form embedded memory.

While not shown, there may be additional conductive interconnects such as conductive interconnect 103A and 103B adjacent to conductive interconnect 103A and 103B such as is illustrated in FIG. 1B and described above.

Figure 5B:
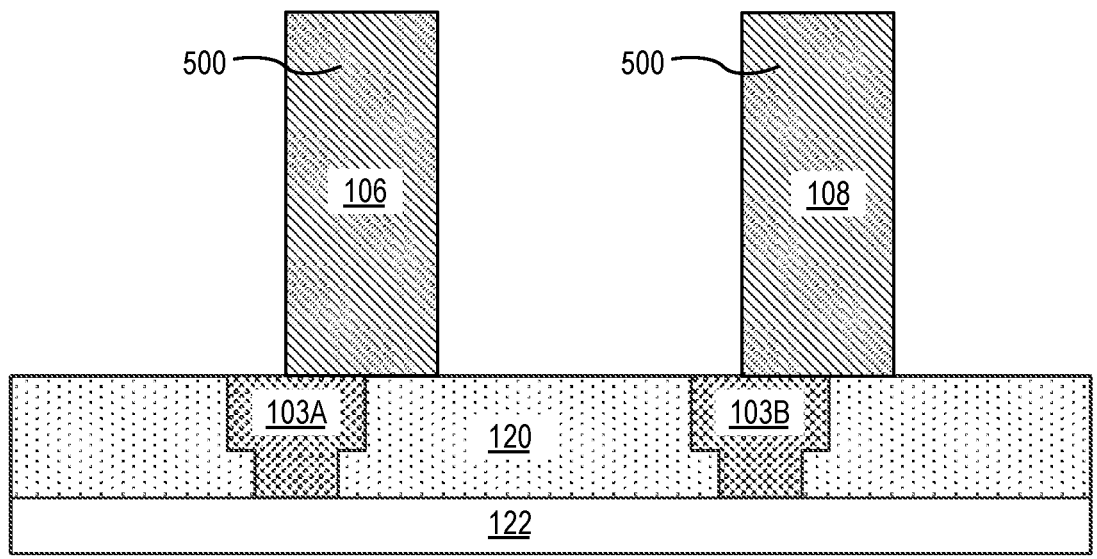
FIG. 5B illustrates a cross-sectional view of the structure in FIG. 5A following formation of a dielectric structure on each of the conductive interconnects.

FIG. 5B illustrates a cross-sectional view of the structure in FIG. 5A following formation of a dielectric structure 106 on conductive interconnect 103A and dielectric structure 108 on conductive interconnect 103B. In an embodiment, a dielectric material 500 is deposited on the structure of FIG. 5A. The dielectric material 500 is then subsequently patterned using a mask and a plasma etch process to form the dielectric structure 106 and dielectric structure 108. The dielectric material 500 may include any material that has sufficient dielectric strength to provide electrical isolation such as, but not, limited silicon dioxide, silicon nitride, silicon oxynitride, carbon doped nitride and carbon doped oxide.

Figure 5C:
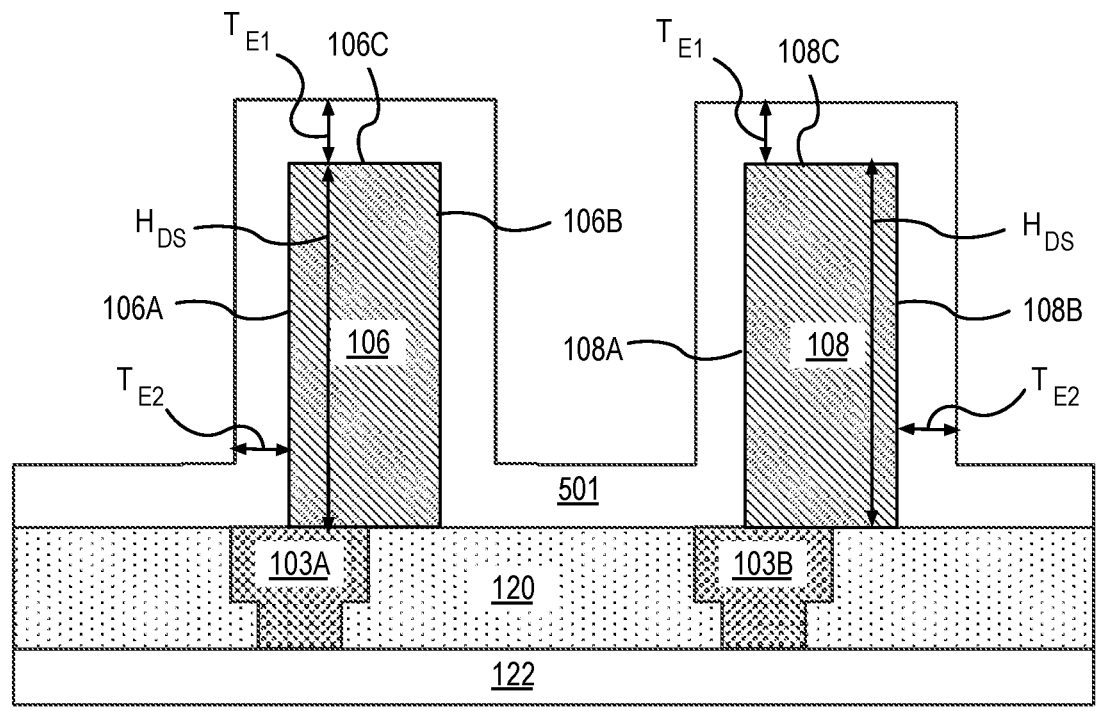
FIG. 5C illustrates a cross-sectional view of the structure in FIG. 5B following a blanket deposition of an electrode layer, including a spin orbit material in accordance with embodiments of the present disclosure.

FIG. 5C illustrates a cross-sectional view of the structure in FIG. 5B following a blanket deposition of an electrode layer 501, including a spin orbit material in accordance with embodiments of the present disclosure. The blanket deposition process involves depositing the electrode layer 501 on the dielectric structures 106 and 108, on the conductive interconnects 103A and 103B and on the dielectric material 120. The electrode layer 501 may include a material that is the same or substantially the same as the material of the electrode layer 101 described above. The electrode layer 501 may be deposited using a physical vapor deposition process, atomic layer deposition process or a combination thereof. In some embodiments, the electrode layer 501 is deposited to a thickness that is between 5 nm and 20 nm. The as deposited thickness of the electrode layer 501 is greater than the final thickness of a SOT electrode to be formed. A fraction of the upper portion of the electrode layer 501 formed on top surfaces 106C and 108C of the dielectric structures 106 and 108, respectively is removed during the fabrication process.

In some examples, deposition process is conformal. In some such examples, the electrode layer 501 that is deposited on the dielectric material 120 on the conductive interconnects 103A and 103B and on top surfaces 106C and 108C has a thickness, $T_{E1}$, that is substantially the same as a thickness, $T_{E2}$, of the electrode layer 501 deposited on vertical sidewalls 106A and 108A (along Y direction) of the dielectric structures 106 and 108. In other examples, the deposition process is not conformal and $T_{E1}$ is greater than $T_{E2}$. In some such examples, the $T_{E2}$ is between 1 nm and 3 nm less than $T_{E2}$. In one such examples, $T_{E2}$ is least 2 nm and $T_{E1}$ is at least 3 nm. It may be appreciated that $T_{E2}$ may not be uniform along sidewalls 106A an 108A. The non-uniformity may be more or less pronounced depending on the height of the dielectric structure, $H_{DS}$. As $H_{DS}$ becomes larger, the deposition aspect ratio for forming electrode layer 501 may impact thickness uniformity during the deposition process.

Figure 5D:
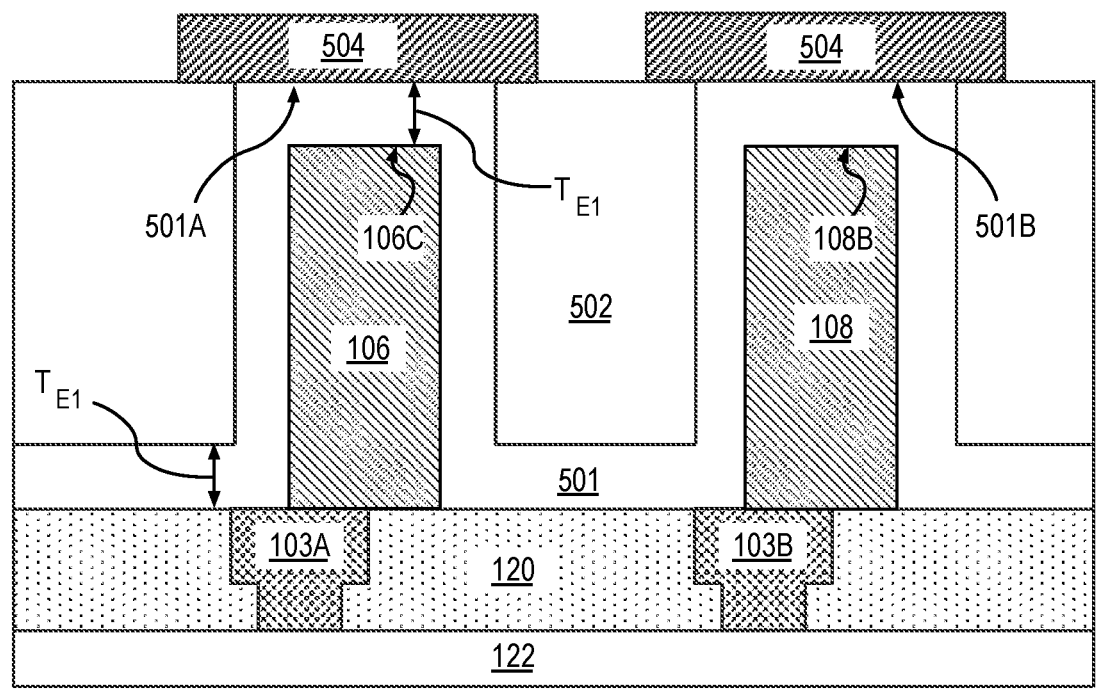
FIG. 5D illustrates a cross-sectional view of the structure in FIG. 5C following a blanket deposition of a first dielectric material on the electrode layer, following planarization of the dielectric material and following the formation of a mask on the electrode layer.

FIG. 5D illustrates a cross-sectional view of the structure in FIG. 5C following a blanket deposition of a dielectric material 502 on the electrode layer 501, following planarization of the dielectric material 502 and following the formation of a mask 504. In an embodiment, the dielectric material 507 is deposited by physical vapor deposition (PVD) or a chemical vapor deposition (CVD) process. The dielectric material 502 may include any material that has sufficient dielectric strength to provide electrical isolation such as, but not, limited silicon dioxide, silicon nitride, silicon oxynitride, carbon doped nitride and carbon doped oxide. The dielectric material 502 may be the same or substantially the same as the material of the dielectric structures 106 and 108. After deposition, the dielectric material 502 is planarized. In an embodiment, the planarization process removes portions of the dielectric material 502 from above the dielectric structures 106 and 108 and exposes uppermost surfaces 501A and 501B of the electrode layer 501. In some embodiments, a portion of the electrode layer 501 formed on surfaces 106C and 108C may be removed by the planarization process. In some such embodiments, after planarization, the electrode layer 501 remaining on surfaces 106C and 108C has a thickness $T_{E3}$ that is different from a thickness, $T_{E1}$, of the portion of the electrode layer 501 formed on the conductive interconnects 103A and 103B. In other embodiments, the planarization process does not alter the thickness of the electrode layer 501 formed above the surfaces 106C and 108C.

After the planarization process a mask 504 is formed. The mask 504 extends over a portion of the electrode layer 501 and over a portion of the dielectric material 502.

Figure 6A:
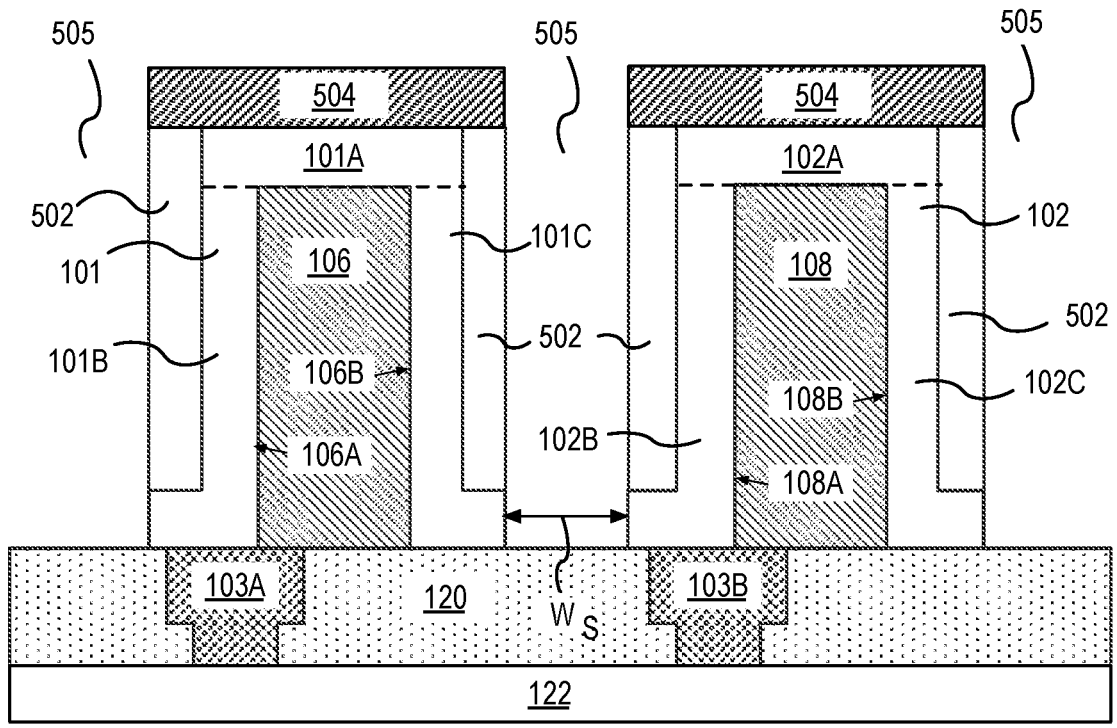
FIG. 6A illustrates the structure of FIG. 5D following the formation of openings in the first dielectric material through the mask and formation of a first and a second spin orbit torque (SOT) electrode.

FIG. 6A illustrates the structure of FIG. 5D following the formation of openings 505 in the first dielectric material 502 through the mask. The openings 505 in the dielectric material 502 may be formed by a plasma etch process. In an embodiment, after forming openings 505 by etching the dielectric material 502, the plasma etch process is continued to remove portions of the electrode layer 501 to form SOT electrode 101 and SOT electrode 102. As shown, the SOT electrode 101 has a top portion 101A and portions 101B and 101C adjacent to sidewalls 110A and 106B, respectively. SOT electrode 102 has a top portion 102A and portions 102B and 102C adjacent to sidewalls 108A and 108B, respectively, also as shown.

In some examples, such as is illustrated, the mask 504 extends over the conductive interconnects 103A and 103B so that the etch process forms SOT electrode portions 101B and 102B that cover the conductive interconnects 103A and 103B, respectively. The opening 505 between the dielectric structure 106 and 112 is designed to have a width, $W_s$, that is sufficiently wide to separate SOT electrode 101 from SOT electrode 102 but not expose the conductive interconnect 103B. The mask 504 also leaves portions of the dielectric material 502 on sidewalls of the dielectric structure 106 and dielectric structure 108.

Figure 6B:
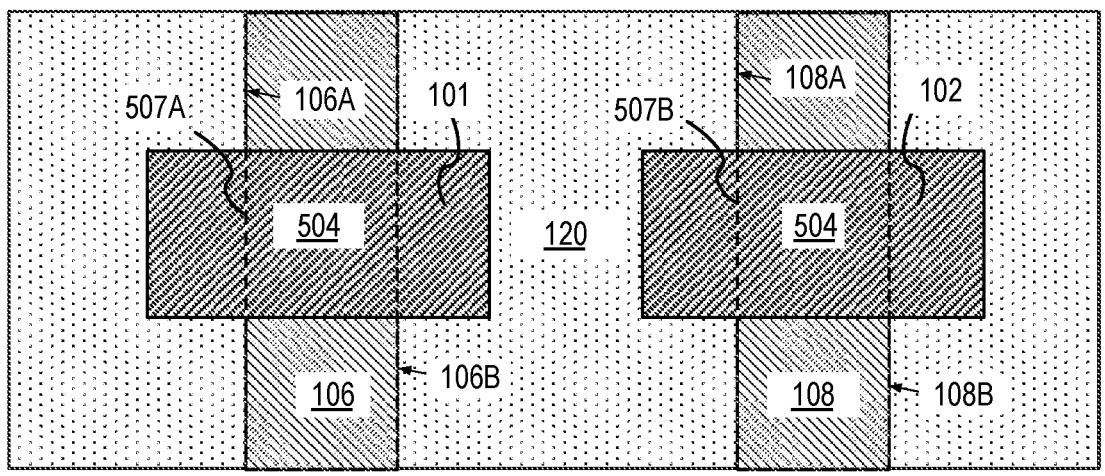
FIG. 6B illustrates a plan-view illustration of the structure of FIG. 6A.

FIG. 6B illustrates a plan-view illustration of the structure of FIG. 6A. The mask 504 extends over the conductive interconnect 103A and 103B (which are hidden in the illustration). Dashed lines 507A outlines the SOT electrode layer portions 101B and 101C that are hidden under the mask 504. SOT electrode layer portions 101B and 101C are removed from sidewalls 106A and 106B of the dielectric structure 106 by the plasma etch process that forms the SOT electrode 101. Dashed lines 507B outlines the SOT electrode layer portions 102B and 102C that are hidden under the mask 504. SOT electrode layer portions 102B and 102C are removed from sidewalls 108A and 108B of the dielectric structure 108 by the plasma etch process that forms the SOT electrode 102.

Figure 7A:
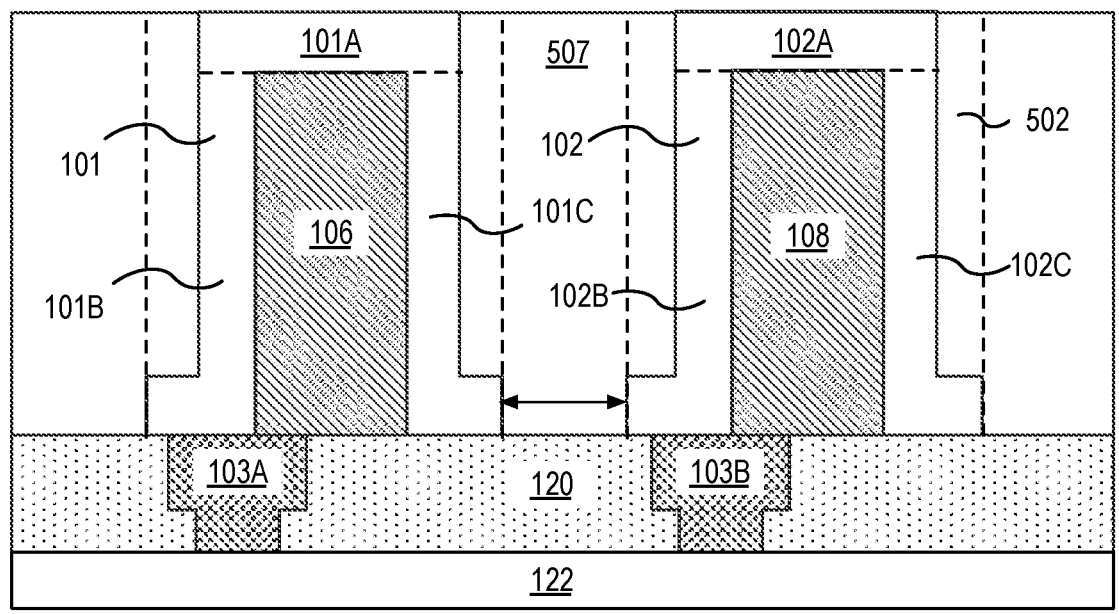
FIG. 7A illustrates the structure of FIG. 6A following the removal of the mask and deposition of a second dielectric material in the openings and following planarization of the second dielectric material.

FIG. 7A illustrates the structure of FIG. 6A following the removal of the mask 504 and deposition of a dielectric material 507 in the openings 505 and following planarization of the dielectric material 507. In an embodiment, the dielectric material 507 is deposited by PVD or a CVD process. The dielectric material 507 may include any material that has sufficient dielectric strength to provide electrical isolation such as, but not, limited silicon dioxide, silicon nitride, silicon oxynitride, carbon doped nitride and carbon doped oxide. The dielectric material 507 may be the same or substantially the same as the material of the dielectric structures 106 and 108. The dielectric material 507 may be the same or substantially the same as the material of the dielectric material 502.

In an embodiment, the planarization process is substantially similar to the planarization process utilized to planarize dielectric material 502 described above.

Figure 7B:
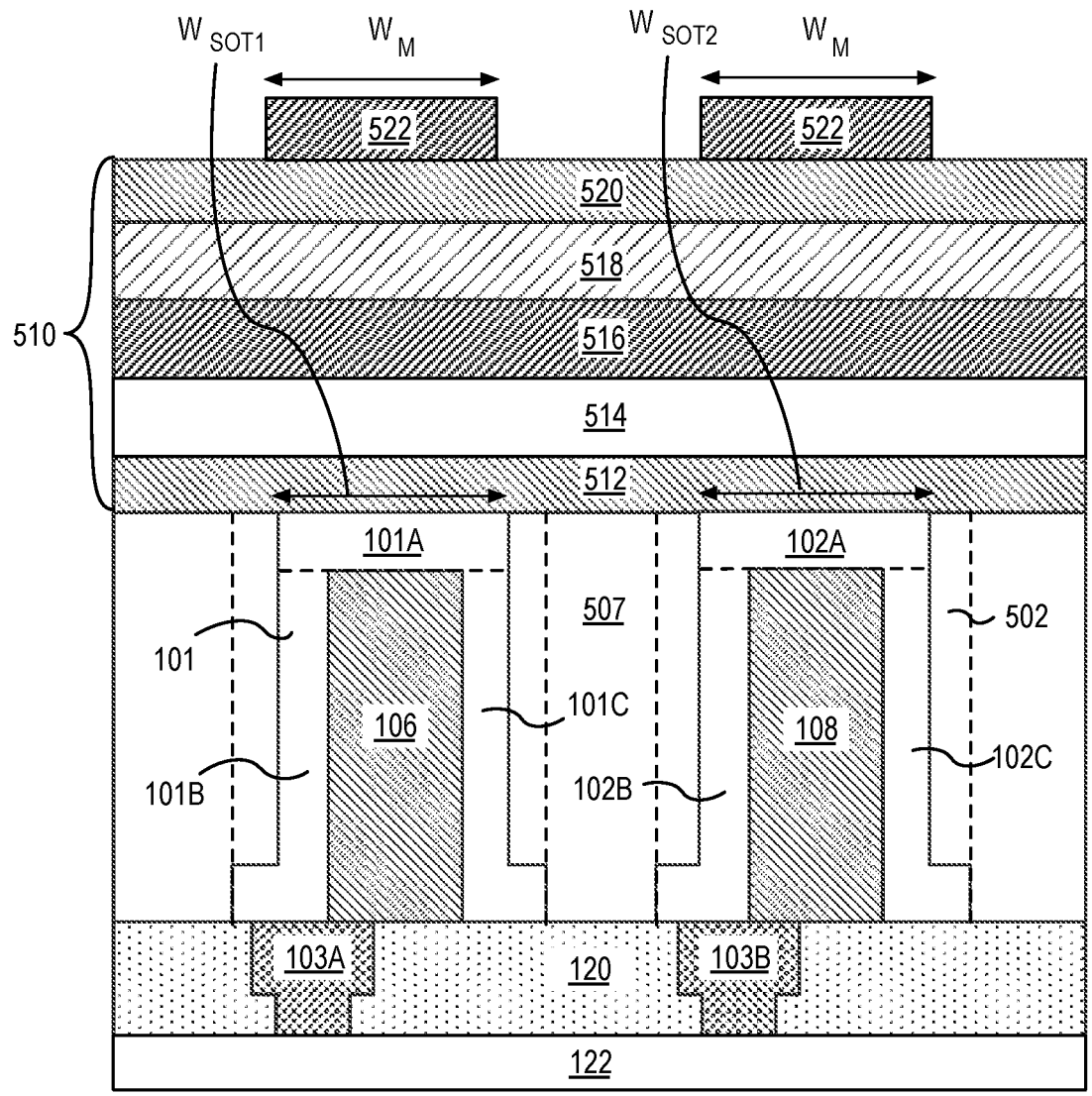
FIG. 7B illustrates the structure of FIG. 7A following the formation of a material layer stack on the first and second SOT electrodes and on the first dielectric material and on the second dielectric material and following the formation of a mask on an uppermost surface of the material layer stack.

FIG. 7B illustrates the structure of FIG. 7A following the formation of a material layer stack 510 to form pMTJ devices and following the formation of a mask on an uppermost surface of the material layer stack. In some embodiments, the free magnetic layer 512 is blanket deposited on the dielectric material 502 and 507, and on the SOT electrode 101 and on the SOT electrode 102. In an embodiment, free magnetic layer 512 includes a material that is the same or substantially the same as the material of the free magnet 110.

A tunnel barrier layer 514 is blanket deposited on the free magnetic layer 512. In an embodiment, the tunnel barrier layer 514 includes a magnesium and oxygen (for e.g. MgO) or aluminum and oxygen (for e.g. $Al_2O_3$). In an exemplary embodiment, the tunnel barrier layer 514 is an MgO and is deposited using a reactive sputter process. In an embodiment, the reactive sputter process is carried out at room temperature. In an embodiment, the tunnel barrier layer 514 is deposited to a thickness between 0.8 nm to 1 nm. In an embodiment, the deposition process is carried out in a manner that yields a tunnel barrier layer 514 having an amorphous structure. In some examples, the amorphous tunnel barrier layer 514 becomes crystalline after a high temperature anneal process to be described further below. In other embodiments, the tunnel barrier layer 514 is crystalline as deposited.

In an embodiment, the fixed magnetic layer 516 is blanket deposited on an uppermost surface of the tunnel barrier layer 514. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 516 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 516 includes a material that is the same or substantially the same as the material of the fixed magnet 114 described above. In some examples, the fixed magnetic layer 516 may be deposited to a thickness between 1.0 nm and 2.5 nm.

The process is continued with deposition of layers utilized to form a SAF structure 518. In some embodiments, the layers utilized to form SAF structure 518 are blanket deposited on the fixed magnetic layer 516 using a PVD process. The layers utilized to form SAF structure 518 are the same or substantially the same as the layers in the SAF structure 116 described above.

In some embodiments, the process utilized to deposit all layers of the material layer stack 516, illustrated in FIG. 5D, is carried without an air break. The individual layers may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In the illustrative embodiment, formation of the SAF structure 518 includes blanket depositing a non-magnetic spacer layer (not shown) on the fixed magnetic layer 516. In some embodiments, the non-magnetic spacer layer includes a metal such as Ta, Ru or Ir.

In an embodiment, the deposition process concludes with a blanket deposition of a capping layer 520 on an uppermost surface of the SAF structure 518. The capping layer 520 may act as a hardmask during etching of the pMTJ material layer stack 516 to form a pMTJ device on the SOT electrode 101. For example, the capping layer 520 includes an etch resistant material such as a metal. In some embodiment, the metal includes Ta or TaN. In an embodiment, the thickness of the capping layer 520 is between 5 nm and 70 nm. The thickness of the capping layer 520 is chosen to accommodate patterning of the pMTJ material layer stack 516 to form a pMTJ device, as well as to act as a top electrode for voltage biasing the pMTJ device.

In an embodiment, after all the layers in the pMTJ material layer stack 516 are deposited, an anneal is performed. In an embodiment, the anneal is performed immediately post deposition but before patterning of the pMTJ material layer stack 516. A post-deposition anneal of the pMTJ material layer stack 516 is carried out in a furnace in a forming gas environment. In an embodiment, the forming gas includes a mixture of $H_2$ and $N_2$ gas. In an embodiment, the anneal temperature ranges between 300 and 350 degrees Celsius.

In an embodiment, the annealing process also promotes solid phase epitaxy of the free magnetic layer 512 to follow a crystalline template of the tunnel barrier layer 514 (e.g., MgO) that is directly above the free magnetic layer 512. In an embodiment, the anneal also promotes solid phase epitaxy of the fixed magnetic layer 516 to follow a crystalline template of the tunnel barrier layer 514 (e.g., MgO) that is directly below the fixed magnetic layer 516. <001> Lattice matching between the tunnel barrier layer 514 and the free magnetic layer 512 and <001> lattice matching between the tunnel barrier layer 514 and the fixed magnetic layer 516 enables a TMR ratio of at least 90% to be obtained in the pMTJ material layer stack 516.

In an embodiment, the annealing process is also performed in the presence of a magnetic field which sets a direction of magnetization of the fixed magnetic layer 516 and of the free magnetic layers 512. In an embodiment, during the annealing process, an applied magnetic field that is directed perpendicular (along the Z axis) to a horizontal plane (along the Y axis) of pMTJ material layer stack 516 enables a perpendicular anisotropy to be set in the fixed magnetic layer 516, in the free magnetic layer 512.

A mask 522 is formed above the material layer stack 516. In some embodiments, the mask 522 is formed by a lithographic process. In other embodiments, the mask 522 includes a dielectric material that has been patterned. The mask 522 defines a shape and size of pMTJ devices and locations where the pMTJ devices are to be subsequently formed with respect the SOT electrode 101 and SOT electrode 102. The mask 522 has a shape and dimension (along X and Z axis) that may be substantially similar to the shape and dimensions (along X and Z axis) of the SOT electrode 101 and SOT electrode 102.

In the illustrative embodiment, the mask 522 has a width $W_M$, that is the same or substantially the same as a width $WSOT1_1$ and $WSOT1_2$, of the SOT electrode 101 and SOT electrode 102, respectively. In other embodiments, $W_M$ is smaller than $WSOT1_1$ and/or $WSOT1_2$.

In an embodiment, the mask 522 is also aligned (along the X and Z axis) with the SOT electrode 101 and SOT electrode 102. In some embodiments, when the mask 522 has a shape and dimension (along X and Z axis) that is substantially similar to the shape and dimensions (along X and Z axis) of the SOT electrode 101 and SOT electrode 102, the etch process may not expose the underlying SOT electrode portions 101A and 102A after formation of pMTJ devices. In some such embodiments, a high density of pSOT memory device array is formed. The spacing between adjacent SOT electrodes 101 and 102 is partially determined by the width, $W_s$ and the size and spacing of the dielectric structures 106 and 108.

Figure 7C:
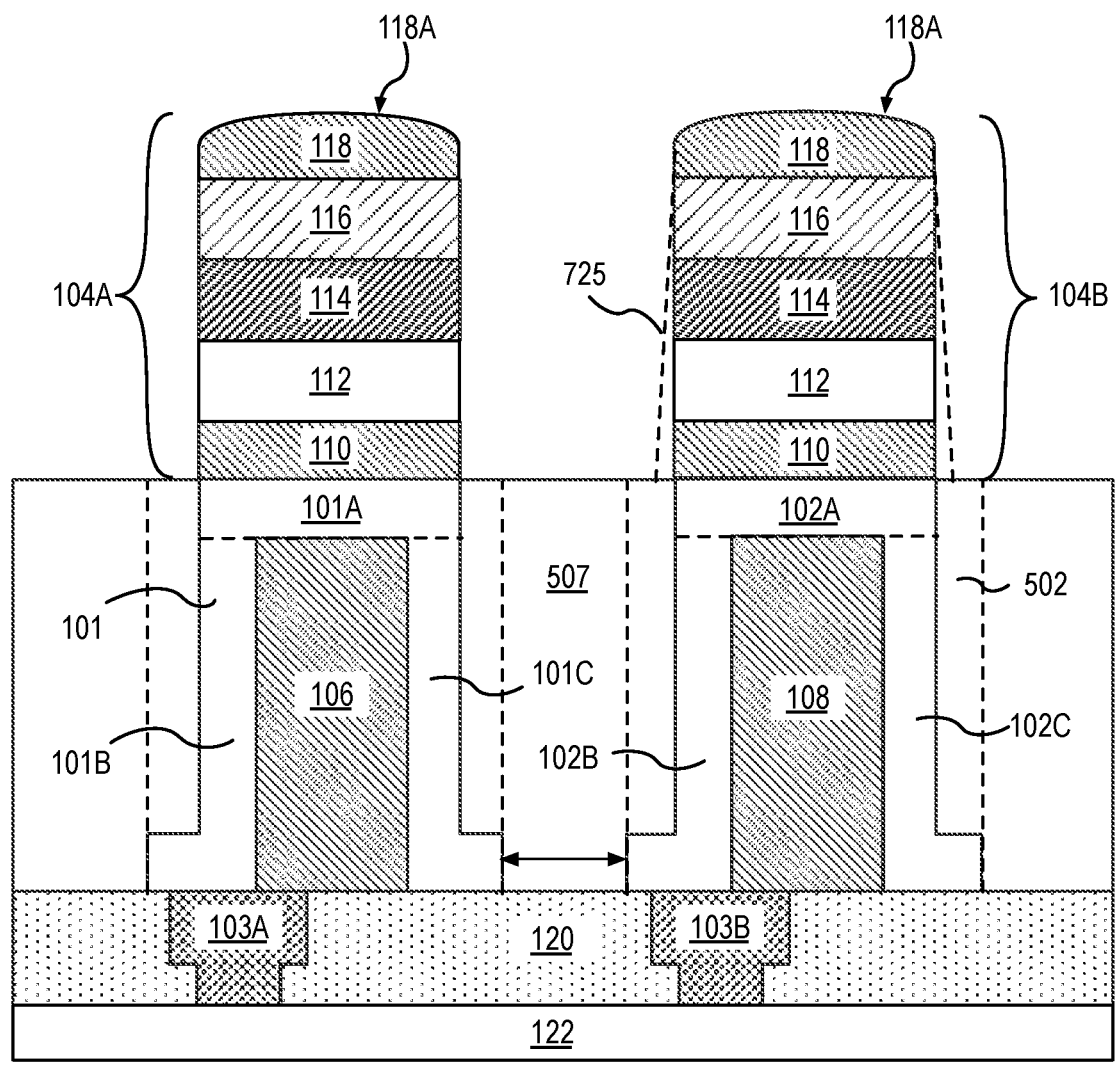
FIG. 7C illustrates a cross-sectional view of the structure in FIG. 7B following the process of etching the material layer stack to form a plurality of magnetic tunnel junction devices.

FIG. 7C illustrates a cross-sectional view of the structure in FIG. 7B following the process of etching the material layer stack 510 to form perpendicular magnetic tunnel junction (pMTJ) device 104A and 104B. In an embodiment, the patterning process first includes etching the capping layer 514 by a plasma etch process to form a top electrode 118. In an embodiment, plasma etch process possesses sufficient ion energy and chemical reactivity to render vertical etched sidewalls of the top electrode 118. In an embodiment, the plasma etch process is then continued to pattern the remaining layers of the material layer stack 510 to form pMTJ device 104A on the SOT electrode 101 and pMTJ device 104B on the SOT electrode 102. The plasma etch process etches the various layers in the material layer stack 510 to form a SAF structure 116, a fixed magnet 114, a tunnel barrier 112, a free magnet 110 in each of the pMTJ device 104A and 104B. In the illustrative embodiment, the top electrode 118 has a curved top surface portion 118A after completely forming the pMTJ devices 104A and 104B.

In some embodiments, depending on the etch parameters, the pMTJ device 104 may have sidewalls that are tapered during the etching process, as indicated by the dashed lines 725. The pMTJ device 104A formed on SOT electrode 101 and coupled with conductive interconnects 103A constitutes the perpendicular spin orbit torque memory device 100A, and pMTJ device 104B formed on SOT electrode 102 and coupled with conductive interconnect 103B constitutes the perpendicular spin orbit torque memory device 100B, described in association with FIG. 1A.

In some embodiments, top surface portions of the dielectric material 502 and 507 adjacent to pMTJ 104A and 104B are recessed during the etching process.

Figure 8A:
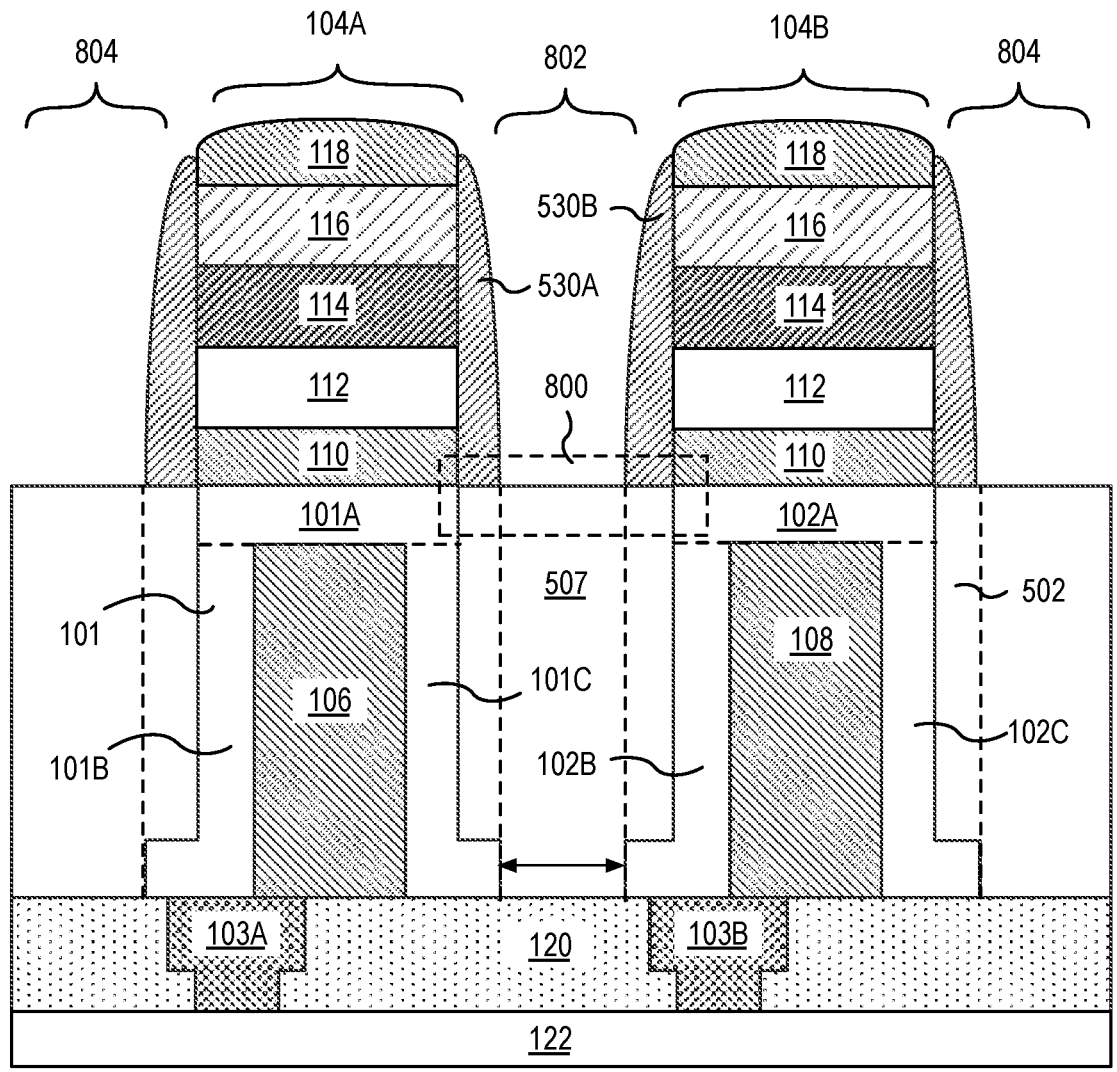
FIG. 8A illustrates a cross-sectional view of the structure in FIG. 7C following the formation of a dielectric spacer adjacent to the plurality of magnetic tunnel junction devices.
Figure 8B:
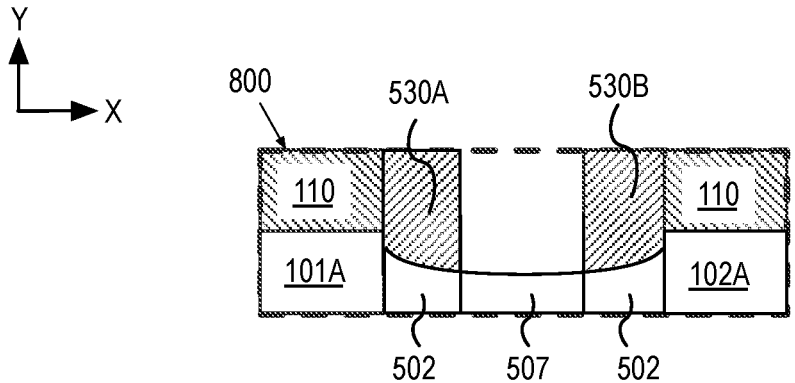
FIG. 8B illustrates a cross-sectional view of a portion of the structure in FIG. 8A.

FIG. 8A illustrates a cross-sectional view of the structure in FIG. 7C following the formation of a dielectric spacer 530A adjacent to the pMTJ device 104A and dielectric spacer 530B adjacent to the pMTJ device 104B. In an embodiment, a dielectric spacer layer is deposited on the pMTJ devices 104A and 104B and on the uppermost surface of the dielectric material 502 and 507. In an embodiment, the dielectric spacer layer is deposited without a vacuum break following the plasma etch process utilized to form the pMTJ device 104A and 104B. In other embodiments the spacer layer is blanket deposited by a PECVD deposition process. The dielectric spacer layer may also be deposited using a PVD or a PECVD deposition process. In some embodiments, the dielectric spacer layer includes a material such as, but not limited to, silicon nitride (e.g., comprising predominantly silicon and nitrogen), carbon doped silicon nitride (e.g., comprising predominantly silicon and nitrogen and a minor faction of carbon), or silicon carbide (e.g., comprising predominantly silicon and carbon). The dielectric spacer 530A and 530B may include an insulator layer that does not have an oxygen content to minimize potential oxidation of magnetic layers. After blanket deposition dielectric spacer layer is etched by a plasma etch process to form the dielectric spacer 530A on sidewalls of the pMTJ device 104A and on sidewalls of the pMTJ device 104B.

In some embodiments, as discussed above, the dielectric material 502 and 507 are recessed during formation of the pMTJ devices 104A and 104B, such as in areas inside dashed lines 800. A location between the pMTJ 104A and 104B (inside dashed lines 800), where the dielectric material 502 and 507 are recessed, is illustrated after formation of the dielectric spacer 530A and 530B in FIG. 8B. In the illustrated example, the top surfaces of the dielectric material 502 and 507 has a concave profile as a result of dielectric spacer layer etch. In other examples, the top surfaces of the dielectric material 502 and 507 may be roughened having no smooth surface or have grooves as a result of the etch process.

In the illustrative embodiment, the dielectric spacer 530A and dielectric spacer 530B are formed adjacent to portions of SOT electrode portions 101A and 102A, respectively. In other examples, dielectric spacer 530A and dielectric spacer 530B may extend below SOT electrode portions 101A and 102A, respectively. In some such embodiments, dielectric spacer 530A and dielectric spacer 530B is adjacent to SOT electrode portions 101C and 102B, respectively.

It is to be appreciated that dielectric material 502 adjacent to SOT electrode portions 101B and 102C may also be recessed. In some examples, dielectric material 502, 507 adjacent to SOT electrode portions 101B and 102C may be recessed by a different amount compared to dielectric material 502, 507 adjacent to SOT electrode portions 101C and 102B. Differences in recess may result from variation in etch effect in region 802 immediately between device structures (for example pMTJ 104A and 104B) compared to open areas 804 adjacent to outer edge portions of device structures.

Figure 9:
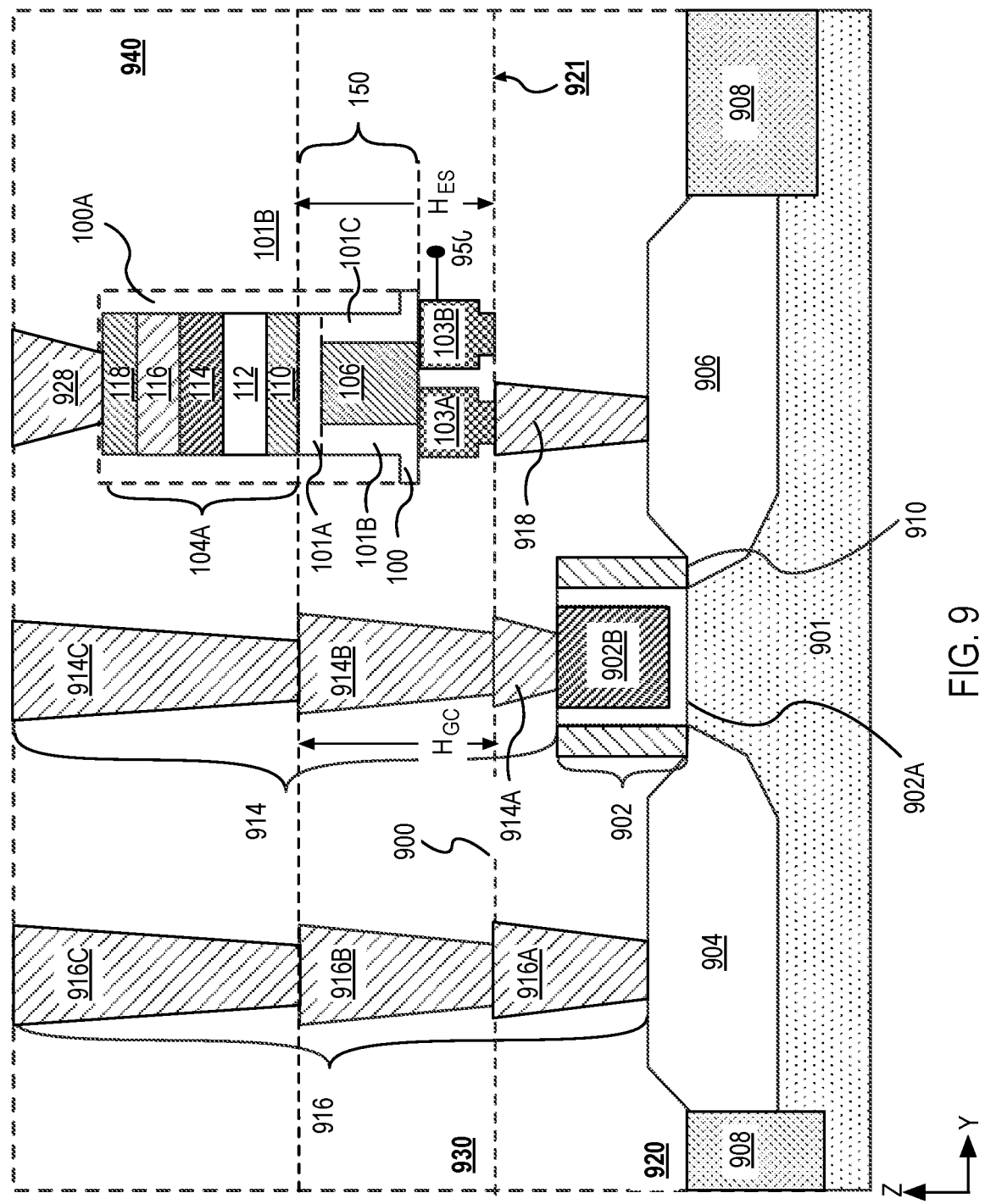
FIG. 9 illustrates a cross-sectional view of a SOT memory device coupled having one terminal coupled to a first transistor, a second terminal coupled to a second transistor, and a third terminal coupled to a bit line.

FIG. 9 illustrates a spin orbit memory device coupled to an access transistor 900. In the illustrative embodiment, the spin orbit memory device is a perpendicular spin orbit memory device 100A. In an embodiment, the spin orbit memory device 100A includes a perpendicular MTJ device 104 on an electrode structure 150. Electrode structure 150 includes a spin orbit electrode 101 having portions 101A on a dielectric structure 114 and portions 101B and 101C on sidewalls of dielectric structure 114, as described in association with FIG. 1A. The spin orbit memory device 100A may include one or more features of the spin orbit memory device 100A described above in embodiments, associated with FIGS. 1A-1F.

In an embodiment, the transistor 900 has a source region 904, a drain region 906 and a gate 902. The transistor 900 further includes a gate contact 914 above and electrically coupled to the gate 902, a source contact 916 above and electrically coupled to the source region 904, and a drain contact 918 above and electrically coupled to the drain region 906 as is illustrated in FIG. 9.

The gate contact 914 has three stacked portions 914A, 914B and 914C as shown. The source contact has three stacked portions 916A, 916B and 916C, also as shown. Portion 914A is directly in contact with the gate 902. The portion 914B has a height, $H_{GC}$, and the electrode structure 150 and the conductive interconnect 103A or 103B combined have a height, $H_{ES}$. In the illustrative embodiment, $H_{ES}$ is substantially equal to $H_{GC}$. As shown, portion 916B has a height, $H_{SC}$. In the illustrative embodiment, $H_{SC}$ is substantially equal to $H_{GC}$ and substantially equal to $H_{ES}$. The height, $H_{ES}$ may represent a thickness of an interconnect metallization structure or circuit components above a transistor in a different portion of the wafer but at a same level as 921.

In the illustrative embodiment, the MTJ device 104 includes a first magnet 110 having a free magnetization such as a free magnet 114, a second magnet above the first magnet, the second magnet having a fixed magnetization, such as a fixed magnet 114, a layer such a tunnel barrier 112 between the first magnet 110 and the second magnet, wherein the layer includes magnesium and oxygen and a second electrode such as a top electrode 118 above the fixed magnet 114. In the illustrative embodiment, the MTJ device 104 is a perpendicular MTJ (pMTJ) device 104. In the illustrative embodiment, the pMTJ device 104 also includes a SAF structure 116 between the top electrode 118 and the fixed magnet 114.

In the illustrative embodiment, the perpendicular spin orbit memory device 100A is a three-terminal device. In one such embodiment, one portion of the spin orbit electrode 101 is in electrical contact with the drain contact 918 of transistor 900 and a second portion of the spin orbit electrode 101 is in contact with an external circuit element 950, such as is shown. In the illustrative embodiment, one portion of the spin orbit electrode 101 is in electrical contact with the drain contact 918 of transistor 900 through the conductive interconnect 103A. As shown, the second portion of the spin orbit electrode 101 is in contact with an external circuit element 950 through the conductive interconnect 103B. The conductive interconnect 103A may be directly above the drain contact 918 as shown. A pMTJ contact 928 is on and electrically coupled with the top electrode 118 of the MTJ device 104.

In an embodiment, when the perpendicular spin orbit memory device 100A is a two-terminal device, the conductive interconnect 103B is not included.

While the perpendicular spin orbit memory device 100A, as illustrated is coupled with a single transistor, the pMTJ contact 928 may be coupled with a component of a second transistor (such as a drain terminal—not shown) and the interconnect metallization structure 940 may be coupled with an external circuit element (not shown).

In an embodiment, the underlying substrate 901 represents a surface used to manufacture integrated circuits. Suitable substrate 901 includes a material such as single crystal silicon, polycrystalline silicon and silicon on insulator (SOI), as well as substrates formed of other semiconductor materials. In some embodiments, the substrate 901 is the same as or substantially the same as the substrate 120. The substrate 901 may also include semiconductor materials, metals, dielectrics, dopants, and other materials commonly found in semiconductor substrates.

In an embodiment, the transistor 900 associated with substrate 901 are metal-oxide-semiconductor field-effect transistors (MOSFET or simply MOS transistors), fabricated on the substrate 901. In some embodiments, the transistor 900 is an access transistor 900. In various implementations of the invention, the transistor 900 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 900 of substrate 901 includes a gate 902. In some embodiments, gate 902 includes at least two layers, a gate dielectric layer 902A and a gate electrode 902B. The gate dielectric layer 902A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 902A to improve its quality when a high-k material is used.

The gate electrode 902B of the access transistor 900 of substrate 901 is formed on the gate dielectric layer 902A and may consist of at least one P-type work function metal or N-type work function metal, depending on whether the transistor is to be a PMOS or an NMOS transistor. In some implementations, the gate electrode 902B may consist of a stack of two or more metal layers, where one or more metal layers are work function metal layers and at least one metal layer is a conductive fill layer.

For a PMOS transistor, metals that may be used for the gate electrode 902B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 902B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 902B may consist of one or more U-shaped metal layers formed atop one or more planar, non-U-shaped layers.

In some implementations of the invention, a pair of sidewall spacers 910 are on opposing sides of the gate 902. The sidewall spacers 910 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 904 and drain region 906 are formed within the substrate adjacent to the gate stack of each MOS transistor. The source region 904 and drain region 906 are generally formed using either an implantation/diffusion process or an etching/deposition process. In the former process, dopants such as boron, aluminum, antimony, phosphorous, or arsenic may be ion-implanted into the substrate to form the source region 904 and drain region 906. An annealing process that activates the dopants and causes them to diffuse further into the substrate typically follows the ion implantation process. In the latter process, the substrate 901 may first be etched to form recesses at the locations of the source and drain regions. An epitaxial deposition process may then be carried out to fill the recesses with material that is used to fabricate the source region 904 and drain region 906. In some implementations, the source region 904 and drain region 906 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 904 and drain region 906 may be formed using one or more alternate semiconductor materials such as germanium or a group III-V material or alloy. And in further embodiments, one or more layers of metal and/or metal alloys may be used to form the source region 904 and drain region 906. In the illustrative embodiment, an isolation 908 is adjacent to the source region 904, drain region 906 and portions of the substrate 901.

In the illustrated embodiment, a dielectric layer 920 is adjacent to the gate contact portion 914A, drain contact 918, source contact portion 916A, gate 902, source region 904, drain region 906 and isolation 908. In the illustrated embodiment, a dielectric material 930 is adjacent to the gate contact portion 914B, drain contact 918, source contact portion 916B, conductive interconnects 103A and 104B, electrode structure 150 and dielectric material 920. In the illustrated embodiment, a dielectric material 940 is adjacent to gate contact portion 914C, source contact portion 916C and pMTJ device 104A and pMTJ contact 928 and dielectric material 930. The isolation 908 and dielectric layer 920 may include any material that has sufficient dielectric strength to provide electrical isolation such as, but not, limited silicon dioxide, silicon nitride, silicon oxynitride, carbon doped nitride and carbon doped oxide.

In an embodiment, the source contact 916, the drain contact 918 and gate contact 914 each include multi-layers of material. In an embodiment, the multi-layers of material include two or more distinct layers of metal such as a layer of Ti, Ru or Al and a conductive cap on the layer of metal. The conductive cap may include a material such as W, Co or Cu.

Figure 10:
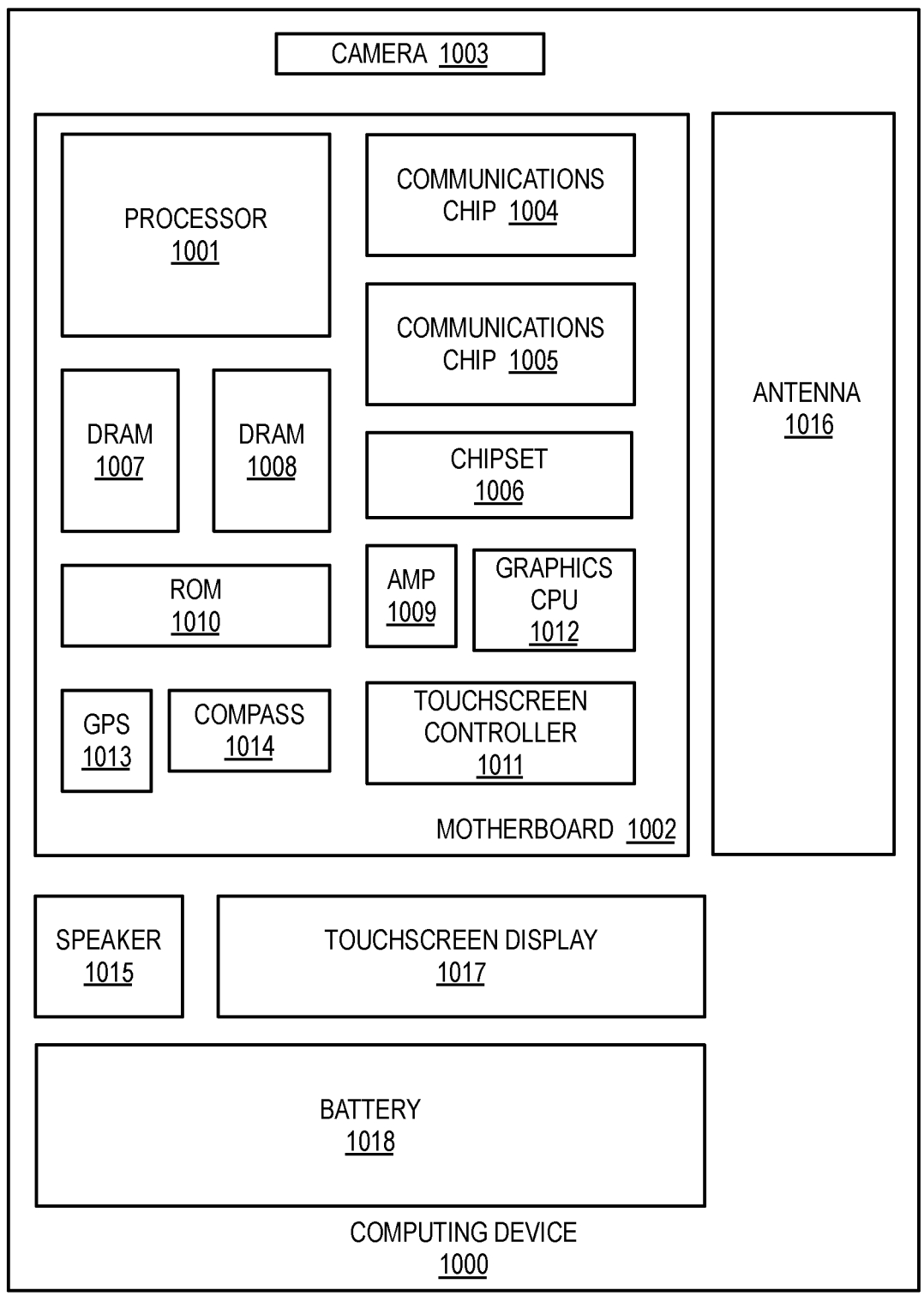
FIG. 10 illustrates a computing device in accordance with embodiments of the present disclosure.

FIG. 10 illustrates a computing device 1000 in accordance with embodiments of the present disclosure. As shown, computing device 1000 houses a motherboard 1002. Motherboard 1002 may include a number of components, including but not limited to a processor 1001 and at least one communications chip 1004 or 1005. Processor 1001 is physically and electrically coupled to the motherboard 1002. In some implementations, communications chip 1005 is also physically and electrically coupled to motherboard 1002. In further implementations, communications chip 1005 is part of processor 1001.

Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset 1006, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1005 enables wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1005 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1000 may include a plurality of communications chips 1004 and 1005. For instance, a first communications chip 1005 may be dedicated to shorter range wireless communications such as Wi-Fi and Bluetooth and a second communications chip 1004 may be dedicated to longer range wireless communications such as GPS, EDGE, GPRS, CDMA, WiMAX, LTE, Ev-DO, and others.

Processor 1001 of the computing device 1000 includes an integrated circuit die packaged within processor 1001. In some embodiments, the integrated circuit die of processor 1001 includes one or more memory devices, such as a spin orbit memory device 100 including a pMTJ device 104 in accordance with embodiments of the present disclosure. The term "processor" may refer to any device or portion of a device that processes electronic data from registers and/or memory to transform that electronic data into other electronic data that may be stored in registers and/or memory.

Communications chip 1005 also includes an integrated circuit die packaged within communication chip 1005. In another embodiment, the integrated circuit die of communications chips 1004, 1005 includes a spin orbit memory device (such as, for example spin orbit memory device 100A described in FIG. 1A). In the illustrative embodiment, spin orbit memory device 100A includes a pMTJ device 104A on an electrode structure 150 having an electrode 101.

Depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics CPU 1012, flash memory, global positioning system (GPS) device 1013, compass 1014, a chipset 1006, an antenna 1016, a power amplifier 1009, a touchscreen controller 1011, a touchscreen display 1017, a speaker 1015, a camera 1003, and a battery 1018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1000 and discussed above may contain a stand-alone integrated circuit memory die that includes one or more arrays of memory cells including one or more memory devices, such as spin orbit memory device 100A including pMTJ device 104A on spin orbit electrode 101A, built in accordance with embodiments of the present disclosure.

In various implementations, the computing device 1000 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
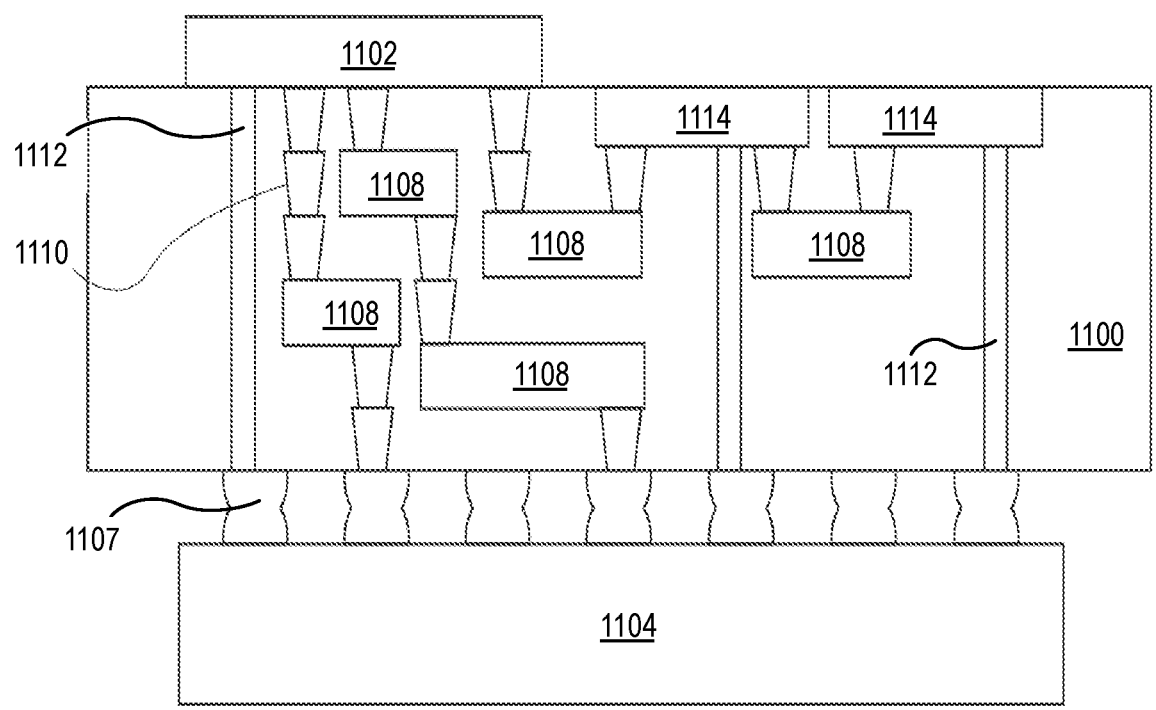
FIG. 11 illustrates an integrated circuit (IC) structure that includes one or more embodiments of the present disclosure.

FIG. 11 illustrates an integrated circuit (IC) structure 1100 that includes one or more embodiments of the disclosure. The integrated circuit (IC) structure 1100 is an intervening substrate used to bridge a first substrate 1102 to a second substrate 1104. The first substrate 1102 may be, for instance, an integrated circuit die. The second substrate 1104 may be, for instance, a memory module, a computer mother, or another integrated circuit die. Generally, the purpose of an integrated circuit (IC) structure 1100 is to spread a connection to a wider pitch or to reroute a connection to a different connection. For example, an integrated circuit (IC) structure 1100 may couple an integrated circuit die to a ball grid array (BGA) 1107 that can subsequently be coupled to the second substrate 1104. In some embodiments, the first and second substrates 1102/1104 are attached to opposing sides of the integrated circuit (IC) structure 1100. In other embodiments, the first and second substrates 1102/1104 are attached to the same side of the integrated circuit (IC) structure 1100. And in further embodiments, three or more substrates are interconnected by way of the integrated circuit (IC) structure 1100.

The integrated circuit (IC) structure 1100 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1108 and vias 1110, including but not limited to through-silicon vias (TSVs) 1112. The integrated circuit (IC) structure 1100 may further include embedded devices 1114, including both passive and active devices. Such devices include, but are not limited to, capacitors, decoupling capacitors, resistors, inductors, fuses, diodes, transformers, device structure including transistors, such as transistors 900 (described in FIG. 9) coupled with a with one at least one spin orbit memory device such as the spin orbit memory device 100A. In one embodiment, the spin orbit memory device 100A (such as, for example spin orbit memory device 100A described in FIG. 1A) includes the pMTJ device 104A on an electrode structure 150 having an electrode 101. The integrated circuit (IC) structure 1100 may further include embedded devices 1114 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1100. In accordance with embodiments of the present disclosure, apparatuses or processes disclosed herein may be used in the fabrication of integrated circuit (IC) structure 1100.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit memory device such as a spin orbit memory device 100A including a spin orbit electrode 101. The spin orbit memory device 100A and spin orbit memory device 100B may be used in an embedded non-volatile memory application.

Thus, embodiments of the present disclosure include spin orbit torque memory devices and methods of fabrication.

In a first example, a memory device, an electrode structure includes a structure having a first sidewall, a second sidewall opposite to the first sidewall, a top surface adjacent and orthogonal to each of the first sidewall and the second sidewall. The structure includes a dielectric. The electrode structure further includes an electrode including a spin orbit material adjacent to the structure, where the electrode has a first electrode portion on the top surface, a second electrode portion adjacent to the first sidewall and a third electrode portion adjacent to the second sidewall and where the first electrode portion, the second electrode portion and the third electrode portion are contiguous. The electrode structure further includes a conductive interconnect in contact with the second electrode portion or the third electrode portion.

In second examples, for any of first examples, the spin orbit material includes one or more of: tantalum, tungsten, platinum, gadolinium, β-Tantalum (β-Ta), Ta, β-Tungsten (β-W), W, Pt, or Copper (Cu) doped with elements including one of: Iridium, or Bismuth.

In third examples, for any of the first through second examples, the structure has a thickness along a first direction, the first electrode portion has a first thickness along the first direction and the second electrode portion and the third electrode portion each have a second thickness along a second direction, and where the first direction is substantially orthogonal to the second direction.

In fourth examples, for any of the first through third examples, the first thickness is greater than the second thickness.

In fifth examples, for any of the first through fourth examples, where the first thickness is at least 3 nm and the second thickness is at least 2 nm.

In sixth examples, for any of the first through fifth examples, the electrode includes a first layer directly adjacent to the structure and a second layer adjacent to the first layer, where the first layer includes a material that is different from a material of the second layer.

In seventh examples, the first through sixth examples, the structure has a thickness along the first direction that is at least 20 times greater than a thickness of the first electrode portion along the first direction.

In eighth examples, for any of the first example, the conductive interconnect is a first conductive interconnect and the first electrode portion is contact with the first conductive interconnect and the electrode structure further includes a second conductive interconnect in contact with the second electrode portion.

In ninth examples, for any of the first through eighth examples, the structure includes silicon and one or more of oxygen or nitrogen.

In tenth examples, for any of the first through ninth examples, where the conductive interconnect includes one or more of Ta, Ru, Cu or Co.

In eleventh examples, a memory device includes a spin orbit electrode structure having a dielectric structure including a first sidewall, a second sidewall opposite to the first sidewall, a top surface adjacent and orthogonal to each of the first sidewall and the second sidewall. The spin orbit electrode structure further includes an electrode having a spin orbit material adjacent to the dielectric structure, where the electrode has a first electrode portion on the top surface, a second electrode portion adjacent to the first sidewall and a third electrode portion adjacent to the second sidewall. The first electrode portion, the second electrode portion and the third electrode portion are contiguous. The spin orbit electrode structure further includes a conductive interconnect in contact with the second electrode portion or the third electrode portion. The memory device further includes a magnetic junction device on a portion of the top surface of the first electrode portion. The magnetic junction device includes a free magnet, a fixed magnet above the free magnet, a layer between the free magnet structure and the fixed magnet and a second electrode on the fixed magnet.

In twelfth examples, for any of the eleventh example, the spin orbit material includes tantalum, tungsten, platinum, gadolinium, β-Tantalum (β-Ta), Ta, β-Tungsten (β-W), W, Pt, or Copper (Cu) doped with elements including one of: Iridium, or Bismuth.

In thirteenth examples, for any of the eleventh through twelfth examples, the first electrode portion has a first width along a first lateral dimension extending from the second electrode portion to the third electrode portion, and the MTJ has a second width along the first lateral dimension and where the second width is substantially equal to the first width.

In a fourteenth example, for any of the eleventh through thirteenth examples, the top surface of the first electrode portion is in contact with a lowermost surface of the free magnet, where the top surface has an area that is greater than an area of the lowermost surface of the free magnet.

In fifteenth example, for any of the eleventh through fourteenth examples, the spin orbit electrode structure is a first spin orbit electrode structure and where a second spin orbit electrode structure is on a same as plane as the first spin orbit electrode structure but separated from the first spin orbit electrode by a dielectric material.

In sixteenth examples, for any of the eleventh through fifteenth examples, the dielectric material between the first spin orbit electrode structure and the second spin orbit electrode structure has a void.

In seventeenth examples, for any of the eleventh through sixteenth examples, the dielectric structure includes a first dielectric structure having a first width along a first lateral dimension and a second dielectric structure on the first dielectric structure having a second width along the first lateral dimension, where the second width is greater than the first width.

In an eighteenth example, an apparatus includes a transistor above a substrate. The transistor includes a drain contact coupled to a drain, a source contact coupled to a source and a gate contact coupled to a gate between the source and the drain. A perpendicular spin orbit memory device is coupled with the drain contact, the perpendicular spin orbit memory device includes a spin orbit electrode structure having a dielectric structure including a first sidewall, a second sidewall opposite to the first sidewall, a top surface adjacent and orthogonal to each of the first sidewall and the second sidewall. The spin orbit electrode structure further includes an electrode having a spin orbit material adjacent to the dielectric structure, where the electrode has a first electrode portion on the top surface, a second electrode portion adjacent to the first sidewall and a third electrode portion adjacent to the second sidewall. The first electrode portion, the second electrode portion and the third electrode portion are contiguous. The spin orbit electrode structure further includes a conductive interconnect in contact with the second electrode portion or the third electrode portion. The memory device further includes a first magnet having free magnetization, a second magnet above the first magnet, the second magnet having a fixed magnetization, a layer between the first magnet and the second magnet, wherein the layer includes magnesium and oxygen and a second electrode coupled with the fixed magnet.

In a nineteenth example, for any of the eighteenth example, the conductive interconnect is coupled and in contact with the drain contact.

In twentieth examples, for any of the eighteenth through nineteenth examples, the conductive interconnect is a first conductive interconnect and the first electrode portion is contact with the first conductive interconnect and the electrode structure further comprises a second conductive interconnect in contact with the second electrode portion.

What is claimed is:

1. An electrode structure comprising:
   a structure comprising a first sidewall, a second sidewall opposite to the first sidewall, and a top surface adjacent and orthogonal to each of the first sidewall and the second sidewall, wherein the structure comprises a dielectric;
   an electrode comprising:
      a first contiguous layer of a first spin orbit material wherein the first contiguous layer comprises:
         a first electrode portion on the top surface;
         a second electrode portion adjacent to the first sidewall; and
         a third electrode portion adjacent to the second sidewall;
      a second contiguous layer of a second spin orbit material other than the first spin orbit material, wherein the second contiguous layer adjoins the first contiguous layer, and wherein the first electrode portion, the second electrode portion, and the third electrode portion are each between the structure and the second contiguous layer; and
   a conductive interconnect in contact with the second electrode portion or the third electrode portion.

2. The electrode structure of claim 1, wherein the first or the second spin orbit material includes one or more of: tantalum, tungsten, platinum, gadolinium, copper doped with elements including one of: iridium or bismuth.

3. The electrode structure of claim 1, wherein the structure has a first thickness along a first direction, the first electrode portion has a second thickness along the first direction and the second electrode portion and the third electrode portion each have a third thickness along a second direction, and wherein the first direction is substantially orthogonal to the second direction.

4. The electrode structure of claim 3, wherein the second thickness is greater than the third thickness.

5. The electrode structure of claim 4, wherein the second thickness is at least 3 nm and the third thickness is at least 2 nm.

6. The electrode structure of claim 3, wherein the first thickness is at least 20 times greater than the second thickness.

7. The electrode structure of claim 1, wherein:
   the conductive interconnect is a first conductive interconnect;
   the first electrode portion is in contact with the first conductive interconnect; and
   the electrode structure further comprises a second conductive interconnect in contact with the second electrode portion.

8. The electrode structure of claim 1, wherein the structure includes silicon and one or more of oxygen or nitrogen.

9. The electrode structure of claim 1, wherein the conductive interconnect includes one or more of Ta, Ru, Cu or Co.

10. A memory device comprising:
    a spin orbit electrode structure comprising:
       a dielectric structure comprising a first sidewall, a second sidewall opposite to the first sidewall, and a top surface adjacent and orthogonal to each of the first sidewall and the second sidewall;
       an electrode comprising a first contiguous layer of a first spin orbit material wherein the electrode has wherein the first contiguous layer comprises:
          a first electrode portion on the top surface;
          a second electrode portion adjacent to the first sidewall; and
          a third electrode portion adjacent to the second sidewall;
       a second contiguous layer of a second spin orbit material other than the first spin orbit material, wherein the second contiguous layer adjoins the first contiguous layer, and wherein the first electrode portion, the second electrode portion, and the third electrode portion are each between the dielectric structure and the second contiguous layer; and
       a conductive interconnect in contact with the second electrode portion or the third electrode portion; and
    a magnetic junction device on a portion of the top surface, the magnetic junction device comprising:
       a free magnet;
       a fixed magnet above the free magnet;
       a layer between the free magnet structure and the fixed magnet; and
       a second electrode on the fixed magnet.

11. The memory device of claim 10, wherein the first or the second spin orbit material includes tantalum, tungsten, platinum, gadolinium, copper doped with elements including one of: iridium or bismuth.

12. The memory device of claim 10, wherein:
    the first electrode portion has a first width along a first lateral dimension extending from the second electrode portion to the third electrode portion;
    the magnetic junction device has a second width along the first lateral dimension; and
    the second width is substantially equal to the first width.

13. The memory device of claim 10, wherein:
    the top surface of the first electrode portion is in contact with a lowermost surface of the free magnet; and
    the top surface has an area that is greater than an area of the lowermost surface of the free magnet.

14. The memory device of claim 10, wherein:
    the spin orbit electrode structure is a first spin orbit electrode structure; and
    a second spin orbit electrode structure is on a same as plane as the first spin orbit electrode structure but separated from the first spin orbit electrode by a dielectric material.

15. The memory device of claim 14, wherein the dielectric material between the first spin orbit electrode structure and the second spin orbit electrode structure has a void.

16. The memory device of claim 10, wherein the dielectric structure comprises:
    a first dielectric structure having a first width along a first lateral dimension;
    a second dielectric structure on the first dielectric structure having a second width along the first lateral dimension; and
    the second width is greater than the first width.

17. An apparatus comprising:
a transistor above a substrate, the transistor comprising:
- a drain contact coupled to a drain;
- a source contact coupled to a source; and
- a gate contact coupled to a gate;

a perpendicular spin orbit memory device coupled with the drain contact, the perpendicular spin orbit memory device comprising:
- a spin orbit electrode structure comprising:
  - a dielectric structure comprising a first sidewall, a second sidewall opposite to the first sidewall, and a top surface adjacent and orthogonal to each of the first sidewall and the second sidewall;
  - an electrode comprising a first contiguous layer of a first spin orbit material, wherein the first contiguous layer comprises:
    - a first electrode portion on the top surface;
    - a second electrode portion adjacent to the first sidewall; and
    - a third electrode portion adjacent to the second sidewall;
  - a second contiguous layer of a second spin orbit material other than the first spin orbit material, wherein the second contiguous layer adjoins the first contiguous layer, and wherein the first electrode portion, the second electrode portion, and the third electrode portion are each between the structure and the second contiguous layer; and
  - a conductive interconnect in contact with the second electrode portion or the third electrode portion; and
- a magnetic junction device on a portion of the top surface of the first electrode portion, the magnetic junction device comprising:
  - a first magnet having free magnetization;
  - a second magnet above the first magnet, the second magnet having a fixed magnetization;
  - a layer between the first magnet and the second magnet, wherein the layer comprises magnesium and oxygen; and
  - a second electrode coupled with the fixed magnet.

18. The apparatus of claim 17, wherein the conductive interconnect is coupled and in contact with the drain contact.

19. The apparatus of claim 17, wherein:
the conductive interconnect is a first conductive interconnect;
the first electrode portion is in contact with the first conductive interconnect; and
the electrode structure further comprises a second conductive interconnect in contact with the second electrode portion.

\* \* \* \* \*